(12) United States Patent
Fujisawa

(10) Patent No.: US 6,885,572 B2
(45) Date of Patent: Apr. 26, 2005

(54) SEMICONDUCTOR MEMORY DEVICE

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 145 days.

(21) Appl. No.: 10/449,570

(22) Filed: May 29, 2003

(65) Prior Publication Data

US 2003/0223262 A1 Dec. 4, 2003

(30) Foreign Application Priority Data

May 31, 2002 (JP) ........................................ 2002-160846

(51) Int. Cl.[7] .............................................. G11C 5/06
(52) U.S. Cl. ................................... 365/63; 365/230.03
(58) Field of Search .............................. 365/63, 230.06

(56) References Cited

U.S. PATENT DOCUMENTS 6,163,475 A * 12/2000 Proebsting .................. 365/63
6,310,815 B1 * 10/2001 Yamagata et al. ..... 365/230.03

* cited by examiner

Primary Examiner—M. Tran

(74) Attorney, Agent, or Firm—Choate, Hall & Stewart LLP

(57) ABSTRACT

There is provided a semiconductor memory device including: a memory cell array; a plurality of sub-banks having a plurality of main amplifiers being placed to the memory cell array and being used to amplify data read from the memory cell array; a plurality of data inputting and outputting pads arranged in a wiring space placed among the sub-banks; a plurality of global input and output lines to connect the main amplifiers and the data inputting and outputting pads; and wherein the sub-banks is divided into a plurality of groups of the sub-banks and the data inputting and outputting pads is divided in a manner so as to be corresponded to the plurality of groups of the sub-banks and wherein the main amplifiers belonging to one of the groups of the sub-banks being placed far from a corresponding data inputting and outputting pads is arranged in same order as the corresponding data inputting and outputting pads, and the main amplifiers belonging to an other of the groups of the sub-banks being placed near to a corresponding data inputting and outputting pads is arranged in order symmetric to an order in which the corresponding data inputting and outputting pads is arranged and wherein its wiring is carried out so that the global input and output lines is placed in a distributed manner without being concentrated in certain places in each of the groups of the sub-banks.

7 Claims, 15 Drawing Sheets

| ×4 | ×8 | ×16 | Pin | | Pin | ×4 | ×8 | ×16 |
|---|---|---|---|---|---|---|---|---|
| VDD | VDD | VDD | 1 | | 66 | Vss | Vss | Vss |
| DQ0 | DQ0 | NC | 2 | | 65 | NC | DQ7 | DQ15 |
| VDDQ | VDDQ | VDDQ | 3 | | 64 | VssQ | VssQ | VssQ |
| DQ1 | NC | NC | 4 | | 63 | NC | NC | DQ14 |
| DQ2 | DQ1 | DQ0 | 5 | | 62 | DQ3 | DQ6 | DQ13 |
| VssQ | VssQ | VssQ | 6 | | 61 | VDDQ | VDDQ | VDDQ |
| DQ3 | NC | NC | 7 | | 60 | NC | NC | DQ12 |
| DQ4 | DQ2 | NC | 8 | | 59 | NC | DQ5 | DQ11 |
| VDDQ | VDDQ | VDDQ | 9 | | 58 | VssQ | VssQ | VssQ |
| DQ5 | NC | NC | 10 | | 57 | NC | NC | DQ10 |
| DQ6 | DQ3 | DQ1 | 11 | | 56 | DQ2 | DQ4 | DQ9 |
| VssQ | VssQ | VssQ | 12 | | 55 | VDDQ | VDDQ | VDDQ |
| DQ7 | NC | NC | 13 | | 54 | NC | NC | DQ8 |
| NC | NC | NC | 14 | | 53 | NC | NC | NC |
| VDDQ | VDDQ | VDDQ | 15 | | 52 | VssQ | VssQ | VssQ |
| LDQS | NC | NC | 16 | | 51 | DQS | DQS | UDQS |
| NC | NC | NC | 17 | | 50 | NC | NC | NC |
| VDD | VDD | VDD | 18 | | 49 | VREF | VREF | VREF |
| NC | NC | NC | 19 | | 48 | Vss | Vss | Vss |
| LDM | NC | NC | 20 | | 47 | DM | DM | UDM |
| /WE | /WE | /WE | 21 | | 46 | /CK | /CK | /CK |
| /CAS | /CAS | /CAS | 22 | | 45 | CK | CK | CK |
| /RAS | /RAS | /RAS | 23 | | 44 | CKE | CKE | CKE |
| /CS | /CS | /CS | 24 | | 43 | NC | NC | NC |
| NC | NC | NC | 25 | | 42 | A12 | A12 | A12 |
| BA0 | BA0 | BA0 | 26 | | 41 | A11 | A11 | A11 |
| BA1 | BA1 | BA1 | 27 | | 40 | A9 | A9 | A9 |
| A10,AP | A10,AP | A10,AP | 28 | | 39 | A8 | A8 | A8 |
| A0 | A0 | A0 | 29 | | 38 | A7 | A7 | A7 |
| A1 | A1 | A1 | 30 | | 37 | A6 | A6 | A6 |
| A2 | A2 | A2 | 31 | | 36 | A5 | A5 | A5 |
| A3 | A3 | A3 | 32 | | 35 | A4 | A4 | A4 |
| VDD | VDD | VDD | 33 | | 34 | Vss | Vss | Vss | x 4 (256M/512M bits)

x 8 (256M/512M bits)

x 16 (256M/512M bits)

US 6,885,572 B2

SEMICONDUCTOR MEMORY DEVICE

BACKGROUND OF THE INVENTION

1. Field of the Invention

The present invention relates to a semiconductor memory device and more particularly to the semiconductor memory device that operates in synchronization with a DRAM (Dynamic Random Access Memory) and/or an external clock such as a synchronous-type DRAM or a like.

The present application claims priority of Japanese Patent Application No. 2002-160846 filed on May 31, 2002, which is hereby incorporated by reference.

2. Description of the Related Art

FIG. 8 is a schematic block diagram showing an example of configurations of a conventional semiconductor memory device. The conventional semiconductor memory device shown in FIG. 8 is a synchronous-type DRAM which operates in a DDR (Double Data Rate) mode. An operation in the DDR mode represents an operation in which a DRAM can operate at a data transfer rate being two times faster than that of a conventional synchronous-type DRAM device by exerting control on inputting and outputting of data in synchronization with both rising and falling edges of a clock. The conventional semiconductor memory device described above includes an internal voltage generating circuit 1, inputting circuits 2 to 6, outputting circuits 7 and 8, a timing producing circuit 9, a command decoder (hereinafter may be referred simply to as a "CD") 10, a latching circuit 11, a refresh counter 12, a column system controlling circuit 13, a row system controlling circuit 14, pre-decoder relieving circuits 15 and 16, a memory cell array (hereinafter may be referred simply to as an "MCA") 17, a sense amplifier 18, a column decoder (hereinafter may be referred simply to as a "YDC") 19, a row decoder (hereinafter may be referred simply to as an "XDC") 20, a read system controlling circuit 21, a write system controlling circuit 22, a local input and output line 23, a sub-amplifier (hereinafter may be referred simply to as a "SubA") 24, a main input and output line 25, a write amplifier (hereinafter may be referred simply to as a "WA") 26, a main amplifier (hereinafter may be referred simply to as an "MA") 27, a global input and output line 28, and FIFO (First In First Out) memories 29 and 30.

The internal voltage generating circuit 1 generates a required internal voltage by boosting and lowering a power source voltage $V_{DD}$ and a ground voltage $V_{SS}$ fed externally. The inputting circuit 2 performs waveform shaping or level conversion on a clock CK and a clock /CK fed externally and then outputs the obtained signal. The clock /CK has a same period as the clock CK and is a signal of opposite phase. The inputting circuit 3 performs waveform shaping or level conversion on a row address strobe signal /RAS, a column address strobe signal /CAS, a write enable signal /WE, a chip select signal /CS, all being fed externally, and outputs the obtained signals. The row address strobe signal /RAS, column address strobe signal /CAS, write enable signal /WE, and chip select signal /CS are all active low. A high ("H") level or a low ("L") level of each of the row address strobe signal /RAS, column address strobe signal /CAS, write enable signal /WE, and chip select signal /CS indicates a command to determine an operation of the conventional semiconductor memory device. The inputting circuit 4 performs waveform shaping or level conversion on an address signal AD made up of a plurality of bits fed externally and outputs the obtained signal. The inputting circuit 5 performs waveform shaping or level conversion on a data strobe signal DQS fed externally and outputs the obtained signal. The data strobe signal DQS is a signal used to adjust timing with which data fed externally is captured in the inputting circuit 6. The inputting circuit 6 is controlled by the data strobe signal DQS fed from the inputting circuit 5 and performs waveform shaping or level conversion on data fed externally through a data input/output terminal DQ and outputs the obtained signal.

The outputting circuit 7 performs waveform shaping or level conversion on the data strobe signal DQS fed from the read system controlling circuit 21 and outputs the obtained signal. The outputting circuit 8 is controlled by the data strobe signal DQS fed from the read system controlling circuit 21 and performs waveform shaping or level conversion on data fed from the FIFO memory 30 and outputs the obtained signal. The timing producing circuit 9 produces various kinds of timing signals based on the clock CK and the clock /CK fed from the inputting circuit 2 and feeds them to the CD 10, latching circuit 11, column system controlling circuit 13, row system controlling circuit 14, read system controlling circuit 21, and write system controlling circuit 22. The CD 10 captures the row address strobe signal /RAS, column address strobe signal /CAS, write enable signal /WE, and chip select signal /CS, all being fed from the inputting circuit 3, according to a timing signal fed from the timing producing circuit 9, decodes commands defined by a combination of an "H" level and "L" level of these signals, produces various control signals according to decoded commands, and feeds the signals to the column system controlling circuit 13, row system controlling circuit 14, read system controlling circuit 21, and write system controlling circuit 22. The latching circuit 11 captures the address signal AD fed from the inputting circuit 4 according to a timing signal fed from the timing producing circuit 9 and, after having latched it, then feeds the obtained signal to the predecoder relieving circuits 15 and 16.

The refresh counter 12, based on a control signal fed from the row system controlling circuit 14, produces a row address for self-refreshing operations and feeds the obtained signal to the pre-decoder relieving circuit 16. The column system controlling circuit 13 captures a control signal fed from the CD 10 according to a timing signal fed from the timing producing circuit 9, produces a control signal used to control the pre-decoder relieving circuit 15, and feeds the obtained signal to the pre-decoder relieving circuit 16. The row system controlling circuit 14 captures a control signal fed from the CD 10 according to a timing signal fed from the timing producing circuit 9, produces a control signal to control the refresh counter 12 and the pre-decoder relieving circuit 16, and feeds the obtained signal to the refresh counter 12 and the pre-decoder relieving circuit 16. The pre-decoder relieving circuit 15 captures the address signal AD fed from the latching circuit 11 according to a control signal fed from the column system controlling circuit 13, decodes a column address from the captured address signal AD and feeds it to the YDC 19 and, at a same time, produces a redundant column address to reduce defective memory cells contained in memory cells making up the MCA 17 and feeds the obtained signal to the YDC 19. The pre-decoder relieving circuit 16 captures the address signal AD fed from the latching circuit 11 according to a control signal fed from the row system controlling circuit 14, decodes a column address from the captured address signal AD and feeds it to the XDC 20 and, at a same time, produces a redundant row address to reduce defective memory cells contained in memory cells making up the MCA 17 and feeds it to the XDC 20.

The MCA 17 has specified capacity, in which a plurality of memory cells MC are arranged, in a matrix form, in a vicinity of each point of intersection of a plurality of bit lines BL and a plurality of word lines WL. The sense amplifier 18 detects data read to a corresponding bit line BL from each of the memory cells MC, amplifies the data and feeds it to the SubA 24 through the local input and output line 23. The YDC 19 decodes a column address fed from the pre-decoder relieving circuit 15 and outputs a plurality of column selecting signals to put the sense amplifier 18 being connected to the corresponding bit line BL in the MCA 17 into a selected state. The XDC 20 decodes a row address fed from the pre-decoder relieving circuit 16 and puts the corresponding word line WL in the MCA 17 into a selected state.

The read system controlling circuit 21 captures a control signal fed from the CD 10 according to a timing signal fed from the timing producing circuit 9, produces a control signal to exert control on the outputting circuits 7 and 8, MA 27, and FIFO memory 30 and then feeds the obtained signal to the outputting circuits 7 and 8, MA 27, and FIFO memory 30. The write system controlling system 22 captures a control signal fed from the CD 10 according to a timing signal fed from the timing producing circuit 9, produces a control signal to exert control on the WA 26 and the FIFO memory 29, and feeds the obtained signal to the WA 26 and the FIFO memory 29. The SubA 24 amplifies data fed from the sense amplifier 18 through the local input and output line 23 and feeds the obtained signal to the MA 27 through the main input and output line 25. The WA 26 amplifies data fed from the FIFO memory 29 through the global input and output line 28 and feeds the obtained signal to the SubA 24 through the main input and output line 25. The MA 27 amplifies data fed from the SubA 24 through the main input and output line 25 and feeds the obtained signal to the FIFO memory 30 through the global input and output line 28. The FIFO memory 30 internally stores, in a first-in manner, data fed from the inputting circuit 6 in synchronization with the clock CK and, at a same time, reads, in a first-out manner, data internally stored in synchronization with the clock CK and feeds it to the WA 26 through the global input and output line 28. The FIFO memory 30 internally stores, in a first-in manner, data fed from the MA 27 in synchronization with the clock CK and, at a same time, reads, in a first-out manner, data internally stored in synchronization with the clock CK and feeds it to the outputting circuit 8.

Next, FIG. 9 is a schematic block diagram showing an example of configurations of the MA 27 and the FIFO memory 30 making up the conventional semiconductor memory device. The MA 27 is made up of sub-main amplifiers (hereinafter may be referred simply to as an "SMA") $27_a$, $27_b$, $27_c$, and $27_d$ whose number corresponds to a number of bits to be pre-fetched (described later) and, in FIG. 9, a case where 4-bit data is pre-fetched is illustrated. That is, the MA 27 includes four pieces of the SMAs $27_a$ to $27_d$ and 4-bit parallel data is amplified by each of the corresponding SMAs $27_a$ to $27_d$. Each of the SMAs $27_a$ to $27_d$ amplifies each of corresponding complementary data $MDT_0$ to $MDT_3$ and $MDTB_0$ to $MDTB_3$ each having a small amplitude so as to become single data on a CMOS (Complementary Metal Oxide Semiconductor) level. Since the SMAs $27_a$ to $27_d$ have a same configuration, only the configuration of the SMA $27_a$ is described hereinafter. The SMA $27_a$ is made up of P-channel MOS transistors $MP_1$ to $MP_5$, N-channel MOS transistors $MN_1$ to $MN_4$, and the inverters $INV_1$ to $INV_3$. The MOS transistors $MP_1$ to $MP_2$ make up an input stage, the MOS transistors $MP_3$ to $MP_4$ and $MN_1$ to $MN_3$ make up an amplification stage, and inverters $INV_1$ to $INV_3$ and the MOS transistors $MP_5$, and $MN_4$ make up an output stage. Each of the SMAs $27_a$ to $27_d$ is connected to the FIFO memory 30 through each of global input and output lines $28_0$ to $28_3$ making up the global input and output line 28 shown in FIG. 8. The FIFO memory 30 is made up of flip-flops $FF_{00}$ and $FF_{01}$, $FF_{10}$ and $FF_{11}$, $FF_{20}$ and $FF_{21}$, and $FF_{30}$ and $FF_{31}$ being cascaded in two stages and corresponding to each of the SMA $27_a$ to $27_d$, and of flip-flops $FF_{40}$ and $FF_{41}$ being cascaded in two stages and being connected respectively to output terminals of the flip-flops $FF_{01}$, $FF_{11}$, $FF_{21}$ and $FF_{31}$ being connected respectively to output terminals of the flip-flops $FF_{00}$, $FF_{10}$, $FF_{20}$ and $FF_{30}$. Each of the flip-flops $FF_{00}$, $FF_{10}$, $FF_{20}$ and $FF_{30}$ latches data output from each of corresponding SMA $27_a$ to $27_d$ using a common latch signal $LT_0$. Each of the flip-flops $FF_{01}$, $FF_{11}$, $FF_{21}$ and $FF_{31}$, in order to convert 4-bit parallel data to 1-bit serial data, latches data output from each of the corresponding flip-flops $FF_{00}$, $FF_{10}$, $FF_{20}$ and $FF_{30}$ using latch signals $LT_1$ to $LT_4$ each being shifted by time corresponding to one cycle of each clock CK. Each of the flip-flops $FF_{40}$ and $FF_{41}$, in order to adjust timing such as latency, latches serial data using latch signals $LT_5$ to $LT_6$ each being shifted by time corresponding to one cycle of each clock CK and then feeds it to the outputting circuit 8.

FIG. 10 is a layout of a main portion showing an arrangement of circuits making up a first conventional semiconductor memory device. The first conventional semiconductor memory device has memory capacity of 512 M bytes being made up of four banks, eight pieces of data inputting and outputting pads (hereinafter may be referred simply to as a "DQ pad") to input and output 8-bit data and being so constructed as to pre-fetch 4-bit data (that is, of a 4-bit pre-fetch structure). The four pieces of banks $31_0$ to $31_3$ are placed in an upper-left portion, lower left portion, upper right portion, and lower right portion of a semiconductor chip. Each of the banks $31_0$ to $31_3$ includes four pieces of MCAs 17 each having memory capacity of 32 M bits, two pieces of YDCs 19, two pieces of XDCs 20, two pieces of SubAs 24, eight pieces of MAs 27, or a like. FIG. 11 is an expanded diagram of a portion in which the MAs 27 in each of the banks $31_0$ to $31_3$ are connected to DQ pads $32_0$ to $32_7$ through global input and output lines 28, out of the layouts shown in FIG. 10. Moreover, in FIGS. 10 and 11, the FIFO memory 30 and the outputting circuit 8 placed in a back stage of the global input and output line 28 shown in FIG. 9 are not shown therein. The global input and output line 28 includes 16 pieces of first lines to connect the MAs 27 faced opposing one another, eight pieces of second lines to connect the first lines being corresponded to one another, and eight pieces of third lines one end of each of which is connected to each of the corresponding second lines and another end of each of which is connected to each of the corresponding DQ pads $32_0$ to $32_7$ being placed on a right side in FIG. 11 in wiring space provided in right and left directions in an approximately central portion of a conventional semiconductor chip. Since each of the global input and output lines 28 transfers 4-bit data, one piece of a line making up the global input and output lines 28 is made up of four sub-lines tied in a bundle and, in the wiring space shown in FIGS. 10 and 11, wiring using a total of 3 two pieces of lines on a bit level is carried out. Moreover, in FIGS. 10 and 11, each of numerals 0 to 7 written in each of rectangles for the MA $27_{00}$ to $27_{07}$, MA $27_{10}$ to $27_{17}$, MA $27_{20}$ to $27_{27}$, MA $27_{30}$ to $27_{37}$, and DQ pads $32_0$ to $32_7$ corresponds to numerical subscripts 0 to 7 of 8-bit DQ0 to DQ7 described later as in the case of a first digit numeral of subscripts of the MA $27_{00}$ to $27_{07}$, MA $27_{10}$ to $27_{17}$, MA $27_{20}$ to $27_{27}$, MA $27_{30}$ to $27_{37}$, and DQ pads $32_1$ to $32_7$. The same can be applied in FIGS. 12 and 13 described later. The MA $27_{00}$ to $27_{07}$, MA $27_{10}$ to $27_{17}$, MA $27_{20}$ to $27_{27}$, MA $27_{30}$ to $27_{37}$, when being collectively called, are simply represented as the MA 27. Similarly, the DQ pads $32_0$ to $32_7$, when being collectively called, are simply represented as the DQ pad 32. The same is applied in descriptions thereafter.

By employing such the layout described above, since a total length of the wiring for the global input and output lines 28 can be made shorter and the global input and output lines 28 can be made same in length and since the banks $31_0$ to $31_3$ are arranged in a cluster, lines and circuits employed in the above layout may be shared between the banks $31_0$ to $31_3$.

FIG. 12 is a layout of a main portion showing an arrangement of circuits making up a second conventional semiconductor memory device. The second conventional semiconductor memory device has memory capacity of 512 M bytes being made up of four banks, eight pieces of DQ pads and being so constructed as to pre-fetch 4-bit data. That is, the second conventional semiconductor memory device has four pieces of banks $31_0$ to $31_3$ being sequentially arranged in up-and-down directions on a conventional semiconductor chip and eight pieces of the DQ pads $32_0$ to $32_7$. Each of the banks $31_0$ to $31_3$ has memory capacity of 64 M bits and includes two pieces of MCAs 17, two pieces of YDCs 19, two sets of a combined XDC 20 and SubA 24, and eight pieces of MAs 27, or a like. The eight pieces of the MAs 27, in the bank $31_0$, for example, are mounted in a manner that the MAs $27_{00}$, $27_{01}$, $27_{02}$, and $27_{03}$ are arranged sequentially from the left to the right in FIG. 12 in a lower portion of the MCA 17 being placed on a left side in FIG. 12 and, on the other hand, the MAs $27_{04}$, $27_{05}$, $27_{06}$, and $27_{07}$ are arranged sequentially from the right to the left in FIG. 12 in a lower portion of the MCA 17 being placed on a right side in FIG. 12. Moreover, in FIG. 12, the FIFO memory 30 and the outputting circuit 8 placed in a back stage of the global input and output line 28 shown in FIG. 9 are not shown therein. The global input and output line 28 includes 16 pieces of first lines to connect the MAs 27 faced opposing one another, eight pieces of second lines one end of each of which is connected to each of corresponding first lines and which extend toward an approximately central portion of the semiconductor chip and through wiring space being placed in up-and-down directions on the chip and another end of each of which is connected to a corresponding another first line of each of the MAs 27 faced opposing one another, and eight pieces of third lines one end of each of which is connected to each of corresponding second lines and another end of each of which is connected to each of corresponding DQ pads $32_0$ to $32_7$ being mounted on a right side in FIG. 12 in wiring space placed in left and right directions in the approximately central portion of the semiconductor chip. Since each of the global input and output lines 28 transfers 4-bit data, one piece of a line making up the global input and output line 28 is made up of four sub-lines tied in a bundle and, in the wiring space shown in FIG. 12. Wiring using a total of 3 two pieces of lines on a bit level is carried out in an upper portion of the DQ pads $32_0$ to $32_7$ in the wiring space in FIG. 12.

By employing such the layout described above, a load on the XDC 20 is reduced to a half when compared with the case shown in FIG. 10, which serves to speed up a process to be performed by the XDC 20.

FIG. 13 is a layout of a main portion showing an arrangement of circuits making up a third conventional semiconductor memory device. The third conventional semiconductor memory device has memory capacity of 512 M bytes being made up of four banks, eight pieces of DQ pads and being so constructed as to pre-fetch 4-bit data. In the third conventional semiconductor memory device, a semiconductor chip is divided into two portions, one being a left portion and another being a right portion and sub-banks $31_{0a}$, $31_{1a}$, $31_{2a}$, $31_{3a}$ each making up four pieces of banks $31_0$ to $31_3$ are sequentially arranged respectively in an upper left portion, lower left portion, upper right portion, and lower right portion in a left half of the semiconductor chip and sub-banks $31_{0b}$, $31_{1b}$, $31_{2b}$, $31_{3b}$ each making up four pieces of banks $31_0$ to $31_3$ are sequentially arranged respectively in an upper left portion, lower left portion, upper right portion, and lower right portion in a right half of the semiconductor chip. The third conventional semiconductor memory device also has eight pieces of DQ pads $32_0$ to $32_7$. Each of the sub-banks $31_{0a}$, $31_{1a}$, $31_{2a}$, and $31_{3a}$ and each of the sub-banks $31_{0b}$, $31_{1b}$, $31_{2b}$, and $31_{3b}$ have one piece of the MCA 17 having memory capacity of 64 bits, one piece of the YDC 19, and one piece of the XDC 20, and four pieces of MAs 27 or a like. In the sub-banks $31_{0a}$ and $31_{2a}$, an MA $27_{00}$, MA $27_{01}$, MA $27_{02}$, MA $27_{03}$ making up the MA 27 and an MA $27_{20}$, MA $27_{21}$, MA $27_{22}$, and MA $27_{23}$ also making up the MA 27 are arranged from an upper direction toward a down direction in wiring space being placed in up-and-down directions in an approximately central portion of a left half of a semiconductor chip and, on the other hand, in the sub-banks $31_{1a}$ and $31_{3a}$, an MA $27_{10}$, MA $27_{11}$, MA $27_{12}$, MA $27_{13}$ making up one of four pieces of the MA 27 and an MA $27_{30}$, MA $27_{31}$, MA $27_{32}$, and MA $27_{33}$ also making up one of four pieces of the MA 27 are arranged from a down direction toward an upper direction in wiring space being placed in up-and-down directions in the approximately central portion of the left half of the semiconductor chip. Moreover, in the sub-banks $31_{0b}$ and $31_{2b}$, an MA $27_{04}$, MA $27_{05}$, MA $27_{06}$, MA $27_{07}$ making up one of four pieces of the MA 27 and an MA $27_{24}$, MA $27_{25}$, MA $27_{26}$, and MA $27_{27}$ also making up one of four pieces of the MA 27 are arranged from an upper direction toward a down direction in wiring space being placed in up-and-down directions in an approximately central portion of a right half of the semiconductor chip and, on the other hand, in the sub-banks $31_{1b}$ and $31_{3b}$, an MA $27_{14}$, MA $27_{15}$, MA $27_{16}$, MA $27_{17}$ making up the MA 27 and an MA $27_{34}$, MA $27_{35}$, MA $27_{36}$, and MA $27_{37}$ also making up the MA 27 are arranged from a down direction toward an upper direction in wiring space being placed in up-and-down directions in the approximately central portion of the right half of the semiconductor chip.

In FIG. 13, the SubA 24 and the FIFO memory 30 and the outputting circuit 8 being placed in a back stage of the global input and output line 28 shown in FIG. 9 are not shown therein. In a left half of the semiconductor chip, the global input and output line 28 is made up of eight pieces of first lines each connecting the MAs 27 faced opposing one another, four pieces of second lines each connecting the first lines being corresponded to each other, and four pieces of third lines being placed toward an approximately central center of wiring space being placed in left and right directions in an approximately central portion of the semiconductor chip, one end of each of which is connected to each of corresponding second lines and another end of each of which is connected to each of the corresponding DQ pads $32_0$ to $32_3$ being placed on a slightly right side in an approximately central portion of the semiconductor chip. On the other hand, in a right half of the semiconductor chip, the global input and output line 28 is made up of eight pieces of first lines each connecting the MAs 27 faced opposing one another, four pieces of second lines each connecting the first lines being corresponded to each other, and four pieces of third lines one end of each of which is connected to each of corresponding second lines and another end of each of which is connected to each of the corresponding DQ pads $32_0$ to $32_3$ being placed at a right end of wiring space being placed in left and right directions in an approximately central portion of the semiconductor chip. Since each of the global input and output lines 28 transfers 4-bit data, one piece of a line making up the global input and output lines 28 is made up of four sub-lines tied in a bundle and in the wiring space being placed in left and right directions in an approximately central portion of the semiconductor chip shown in FIG. 13, wiring using a total of sixteen lines on a bit level is carried out.

A reason why the DQ pads $32_0$ to $32_7$ in the above-described first, second, and third conventional semiconductor memory devices are arranged from the left to the right in FIGS. 10, 12, and 13 in the right half of the wiring space being placed in the left and right directions in an approximately central portion of the semiconductor chip is as follows. That is, a pin arrangement for a synchronous-type DRAM being operable in a DDR mode is normalized by JEDEC (Joint Electron Device Engineering Council) serving as an organization for standardization as shown in FIG. 14. In FIG. 14, the pin arrangement marked by "×8 (256 M/512 M) bit" corresponds to the layouts shown in FIGS. 10, 12, and 13 in which each of pins having its pin numbers 2, 5, 8, 11, 56, 59, 62, and 65 each being called the DQ0 to DQ7 as pin names is connected to each of the DQ pads $32_0$ to $3_{27}$.

For this reason, the global input and output line 28 has a largest wiring length out of data buses and large loads and, if a length of a longer side of the semiconductor chip is 12 mm, a length of each of the global input and output lines 28 is 6 mm, which causes inconvenience described below. That is, in the first conventional semiconductor memory device shown in FIG. 10, a length of each of the global input and output lines 28 to connect the MA $27_{30}$ to the DQ pad $32_0$ is different greatly from a length of each of the global input and outlines 28 to connect the MA $27_{00}$ to the DQ pad $32_0$. Thus, due to a difference in length between the global input and output lines 28, data transmitted through the global input and output line 28 from the MA $27_{00}$ to the DQ pad $32_0$ arrives later than data transmitted through the global input and output line 28 from the MA $27_{30}$ to the DQ pad $32_0$. Such a variation in delayed time in data transmission is called "skew". FIG. 15 is a timing chart showing such the delayed time as described above. Let it be assumed here that a period of the clock CK fed externally shown by (1) in FIG. 15 is 2 ns (nanoseconds). When a read command READ being one of commands CMD decoded by the CD 10 shown in FIG. 8 is fed in synchronization with the clock CK and with timing shown by (2) in FIG. 15 and when a column selecting signal YS is fed with timing shown by (3) in FIG. 15 from the pre-decoder relieving circuit 15 to the TDC 19, complementary data $MDT_0$ to $MDT_3$ and $MDTB_0$ to $MDTB_3$ each having a small amplitude (only data $MDT_3$ is shown by (4) in FIG. 15) are fed. At this point, there is almost no difference in arriving time among the complementary data $MDT_0$ to $MDT_3$ and $MDTB_0$ to $MDTB_3$ each having a small amplitude to be fed to each of the MAs 27.

However, since the length of each of the global input and output lines 28 to connect the MA $27_{30}$ to the DQ pad $32_0$ is different from the length of each of the global input and output lines 28 to connect the MA $27_{00}$ to the DQ pad $32_0$, there occurs a difference of time TD in arriving time, as shown by (5) and (6) in FIG. 15, between data $DT_3$ which reaches the DQ pad $32_0$ through the global input and output line 28 after the complementary data $MDT_3$ and $MDTB_3$ each having a small amplitude have been amplified in the MA $27_{30}$ and data $DT_0$ which reaches the DQ pad $32_0$ through the global input and output line 28 after the complementary data $MDT_0$ and $MDTB_0$ each having a small amplitude have been amplified in the MA $27_{30}$. This time TD, that is, the skew is about 3 ns. As a result, a margin $T_M$ used for a latching operation by a latch signal LT (shown by (7) in FIG. 15) fed in the FIFO memory 30 externally becomes 1 ns or less. This time TD is a main factor to determine a limit of operational frequencies of the synchronous-type DRAM. An inconvenience occurs that, if data being stored in each of the MCAs 17 making up different banks is read, due to the skew in data transmission among banks, timing with which data is latched cannot be ensured.

In this respect, a method for ensuring the margin TM may be thought out in which a technique of latching data of a plurality of bits is further developed in the FIFO memory 30 which has been worked out originally to solve such the problem as above, that is, in which a number of bits of data to be latched in the FIFO memory 30 is increased so as to be 8 bits (that is, in the case of an 8-bit pre-fetch structure), 16 bits (that is, in the case of a 16-bit pre-fetch structure), or more. That is, if a period tCK of a clock CK is 2 ns, in the case of a synchronous-type DRAM of 4-bit pre-fetch structure called a "DDRII" out of the synchronous-type DRAMs being operable in a DDR mode, a transfer period in the global input and output line 28 is 4 ns. However, the transfer period in the global input and output line 28 in the case of the synchronous-type DRAM of 8-bit pre-fetch structure is 8 ns and the transfer period in the global input and output line 28 in the case of the synchronous-type DRAM of 16-bit pre-fetch structure is 16 ns. However, the above method has a disadvantage. That is, if the number of bits of data to be latched is increased as above, since a number of the global input and output lines 28 becomes 6 four pieces, 12 eight pieces, or more, wiring space, placed in left and right directions in an approximately central portion in a semiconductor chip, being wider than wiring space (about 500 μm) being employed at present which is already sufficiently wide, is required, which causes an area of the semiconductor chip to be the wider. Moreover, even if this method is employed, it is impossible to properly cope with future possible speedup of a clock. Moreover, in order to reduce skew, it can be thought out that a repeater to amplify data is to be placed at some midpoint in the longer global input and output line 28. However, it is structurally difficult to place such the repeater in the DRAM being operable in the DDR mode due to restriction on an area of a semiconductor chip or a like.

The second conventional semiconductor memory device shown in FIG. 12 has a same disadvantage as the first conventional semiconductor device shown in FIG. 10 in that a total length of the global input and output line 28 is as long as about 20 mm and differences in length among the global input and output lines 28 used to connect each of the MAs 27 to each of the corresponding DQ pads 32 are large (about 9 to 11.5 mm). Moreover, the third conventional semiconductor memory device shown in FIG. 13 also has same disadvantages as the first and second conventional semiconductor memory device in that, in addition to the problems seen in the first and second semiconductor memory device, as is apparent from FIG. 13, same problems occur since there are differences in length among the global input and output lines 28 used to connect each of the MAs 27 to each of the DQ pads $32_0$ to $32_3$ and the global input and output lines 28 used to connect each of the MAs 27 to each of the DQ pads $32_4$ to $32_7$.

The inconveniences described above occur in a DRAM which enables high-speed data transfer called a "Rambus DRAM" (trade name) in a same manner as above. That is, in the Rambus DRAM being available at present, a frequency of data to be transferred through a global input and output line is 100 MHz being lower than that employed in the DRAM being operable in the DDR mode and reduction of the time $T_D$ described above is not required and therefore any countermeasures have not been taken. However, since, in the above Rambus DRAM, DQ pads are mounted and 8-bit data is latched in a FIFO memory, when the number of the frequency being employed now is increased for speed-up of the data transfer in the future, it is inevitable that the same problems as above occur. Here, for reference, one example of configurations of the Rambus DRAM is explained. That is, a Rambus DRAM has memory capacity of 288 M bits and, if it is of an 18-bit DQ and 8-bit pre-fetch structure, its clock frequency is 400 MHz, its operational frequency is 800 MHz, a frequency of data to be transferred through a global input and output line is 100 MHz, and a number of the global input and output lines is 144 (in the case of common use for reading and writing).

SUMMARY OF THE INVENTION

In view of the above, it is an object of the present invention to provide a semiconductor memory device capable of reducing skew in data transfer and speeding up an operational frequency without being restricted by positions of data inputting and outputting pads and of reducing an area of the semiconductor memory device by arranging global input and output lines in a distributed manner.

According to a first aspect of the present invention, there is provided a semiconductor memory device including:

at least one piece of a memory cell array;

a plurality of sub-banks having a plurality of main amplifiers being placed in a vicinity of the memory cell array and being used to amplify data read from the memory cell array;

a plurality of data inputting and outputting pads arranged according to predetermined specifications in a wiring space placed among the plurality of the sub-banks;

a plurality of global input and output lines to connect the plurality of the main amplifiers and the plurality of the data inputting and outputting pads; and wherein the plurality of the sub-banks is divided into a plurality of groups of the sub-banks and the plurality of the data inputting and outputting pads is divided in a manner so as to be corresponded to the plurality of the groups of the sub-banks and wherein the plurality of the main amplifiers belonging to one of the groups of the sub-banks being placed far from a corresponding plurality of the data inputting and outputting pads is arranged in same order as the corresponding plurality of the data inputting and outputting pads, and the plurality of the main amplifiers belonging to an other of the groups of the sub-banks being placed near to a corresponding plurality of data inputting and outputting pads is arranged in order symmetric to an order in which the corresponding plurality of the data inputting and outputting pads is arranged and wherein wiring of the plurality of the global input and output lines is carried out so that the plurality of the global input and output lines is placed in a distributed manner without being concentrated in certain places in each of the groups of the sub-banks.

In the foregoing first aspect, a preferable mode is one wherein on a semiconductor chip are formed the at least one piece of the memory cell array, the plurality of sub-banks, the plurality of data inputting and outputting pads and the plurality of global input and output lines, and wherein the wiring of the plurality of the global input and output lines is carried out such that the plurality of the global input and output lines, after having extended to an end portion of the semiconductor chip along the wiring space, returns back toward a central portion of the wiring space, whereby the plurality of the global input and output lines connects the plurality of the main amplifiers belonging to the other of the groups of the sub-banks and the corresponding plurality of the data inputting and outputting pads.

Another preferable mode is one wherein a plurality of the global input and output lines for connecting a plurality of the main amplifiers belonging to a specified one of the groups of the sub-banks to a corresponding plurality of the data inputting and outputting pads is placed in a different region from a region in which a plurality of the global input and output lines for connecting a plurality of the main amplifiers belonging to an other one of the groups of the sub-banks to a corresponding plurality of the data inputting and outputting pads is placed.

Still another preferable mode is one wherein the different region is a wiring region formed in a manner so as to be adjacent to an end portion of the semiconductor chip.

An additional preferable mode is one wherein the different region is a region existing on the memory cell arrays.

According to a second aspect of the present invention, there is provided a semiconductor memory device including:

at least one piece of a memory cell array;

a plurality of sub-banks having a plurality of main amplifiers being placed in a vicinity of the memory cell array and being used to amplify data read from the memory cell array;

a plurality of data inputting and outputting pads arranged according to predetermined specifications in a wiring space placed among the plurality of the sub-banks;

a plurality of global input and output lines to connect the plurality of the main amplifiers and the plurality of the data inputting and outputting pads;

wherein on a semiconductor chip are formed the at least one piece of the memory cell array, the plurality of the sub-banks, the plurality of the data inputting and outputting pads and the plurality of the global input and output lines, and wherein the plurality of the sub-banks is divided into a plurality of groups of the sub-banks and the plurality of the data inputting and outputting pads is divided so as to be corresponded to the plurality of the groups of the sub-banks and the plurality of the main amplifiers making up respectively the plurality of the sub-banks belonging to one group are arranged in a manner so as to be symmetric to the plurality of the main amplifiers making up respectively the plurality of the sub-banks belonging to an other group being adjacent to the one group and wherein the plurality of the global input and output lines to connect each of the plurality of the main amplifiers making up respectively the plurality of the sub-banks belonging to the one group to each of the plurality of the data inputting and outputting pads being placed on a side of a central portion of the semiconductor chip in a first wiring space, after having extended along a second wiring space being orthogonal to the first wiring space, reaches the data inputting and outputting pads being placed on a side of the central portion of the semiconductor chip and the plurality of the global input and output lines to connect each of the plurality of the main amplifiers making up each of the plurality of the sub-banks belonging to the other group to each of the plurality of the data inputting and outputting pads being placed on a side of a back end of the semiconductor chip in the first wiring space, after having extended along a wiring region formed in a manner to be orthogonal to the first wiring space and to be adjacent to the back end of the semiconductor chip, reaches the plurality of the data inputting and outputting pads being placed on a side of an end portion of the semiconductor chip.

According to a third aspect of the present invention, there is provided a semiconductor memory device including:

at least one piece of a memory cell array;

a plurality of sub-banks having a plurality of main amplifiers being placed in a vicinity of the memory cell array and being used to amplify data read from the memory cell array;

a plurality of data inputting and outputting pads arranged according to predetermined specifications in a wiring space placed among the plurality of the sub-banks;

a plurality of global input and output lines to connect the plurality of the main amplifiers and the plurality of the data inputting and outputting pads;

wherein on a semiconductor chip are formed the at least one piece of the memory cell array, the plurality of sub-banks, the plurality of data inputting and outputting pads and the plurality of global input and output lines, wherein the plurality of the sub-banks is divided into a plurality of groups of the sub-banks and the plurality of the data inputting and outputting pads is divided so as to be corresponded to the plurality of the groups of the sub-banks and the plurality of the main amplifiers making up each of the plurality of the sub-banks belonging to one group are arranged in a manner so as to be symmetric to the plurality of the main amplifiers making up each of the plurality of the sub-banks belonging to an other group being adjacent to the one group, and wherein the plurality of the global input and output lines to connect each of the plurality of the main amplifiers making up each of the plurality of the sub-banks belonging to the one group to each of the plurality of the data inputting and outputting pads being placed on a side of a central portion of the semiconductor chip in a first wiring space, after having been formed in a manner so as to be orthogonal to the first wiring space and instead of part of power lines to be formed on the memory cell arrays, reaches the plurality of the data inputting and outputting pads being placed on a side of a central portion of the semiconductor chip and the plurality of the global input and output lines to connect each of the plurality of the main amplifiers making up each of the plurality of the sub-banks belonging to the other group to each of the plurality of the data inputting and outputting pads being placed on a side of an end portion of the semiconductor chip, after having been formed in a manner to be orthogonal to the first wiring space and instead of part of power lines to be formed on the memory cell arrays, reaches the plurality of the data inputting and outputting pads being placed on a side of an end portion of the semiconductor chip.

With the above configurations, the plurality of the sub-banks is divided into the plurality of groups and the plurality of data inputting and outputting pads is divided in a manner so as to correspond to the plurality of the groups of the sub-banks, in which the plurality of main amplifiers belonging to the group being placed far from the plurality of corresponding data inputting and outputting pads is arranged in same order as the plurality of the data inputting and outputting pads belonging to the corresponding group and in which the plurality of main amplifiers belonging to the group being placed near to a plurality of corresponding data inputting and outputting pads is arranged in order being symmetrical to order in which the plurality of data inputting and outputting pads belonging to the corresponding group is arranged and since the plurality of global input and output lines is arranged in the wiring space in a distributed manner without being concentrated in certain places in each of the groups, skew in data transfer can be reduced without being restricted by positions of data inputting and outputting pads, which enables an operational frequency to be speeded up. Moreover, since a number of the global inputting and outputting lines can be reduced, it is possible to reduce an area of a semiconductor chip.

BRIEF DESCRIPTION OF THE DRAWINGS

The above and other objects, advantages, and features of the present invention will be more apparent from the following description taken in conjunction with the accompanying drawings in which:

FIG. 14 is a diagram showing one example of a pin arrangement used in each of the first to third conventional semiconductor memory devices.

DETAILED DESCRIPTION OF THE PREFERRED EMBODIMENTS

Best modes of carrying out the present invention will be described in further detail using various embodiments with reference to the accompanying drawings.

First Embodiment

Figure 1:
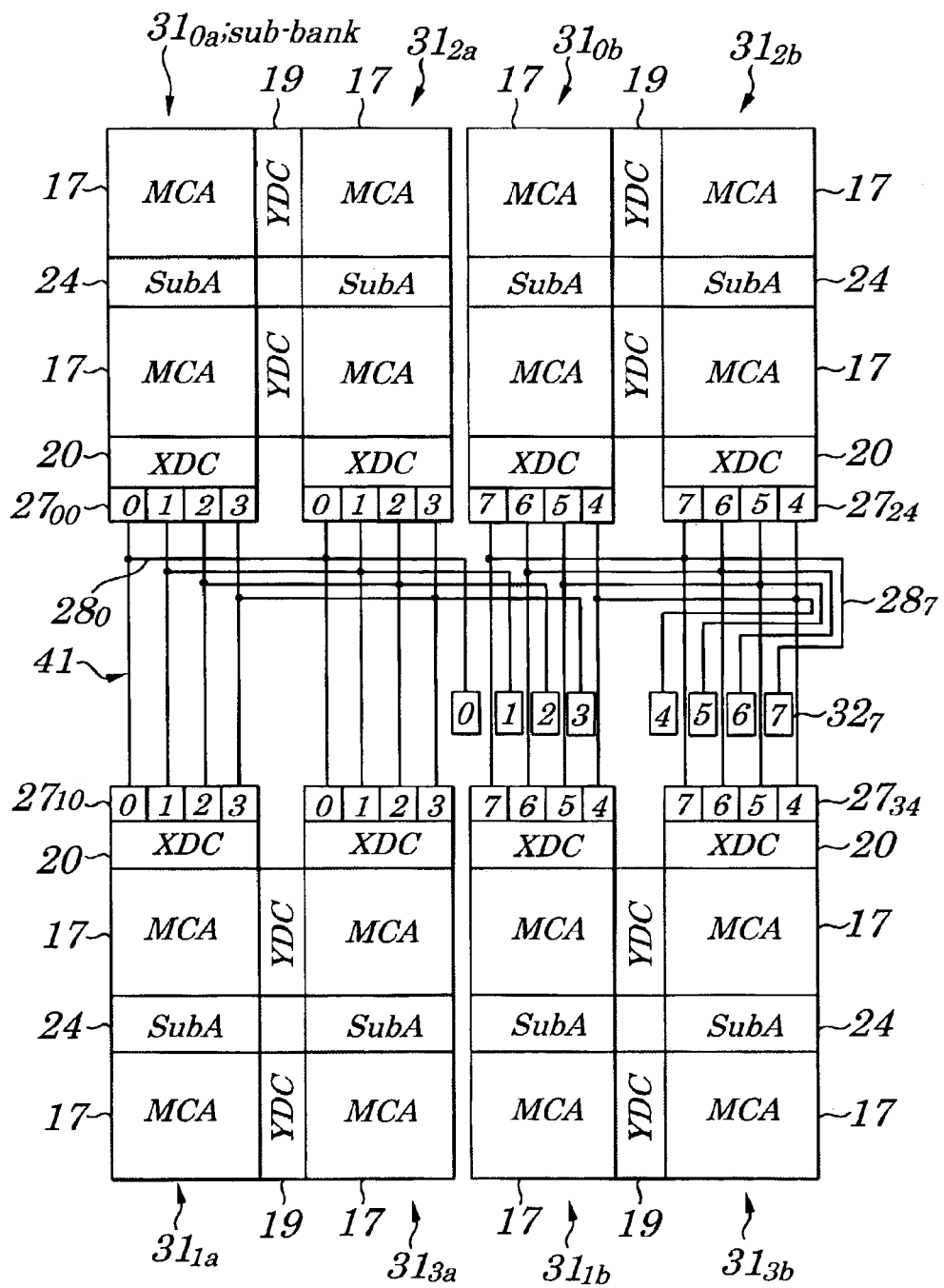
FIG. 1 is a layout of a main portion showing an arrangement of circuits making up a semiconductor memory device according to a first embodiment of the present invention.
Figure 2:
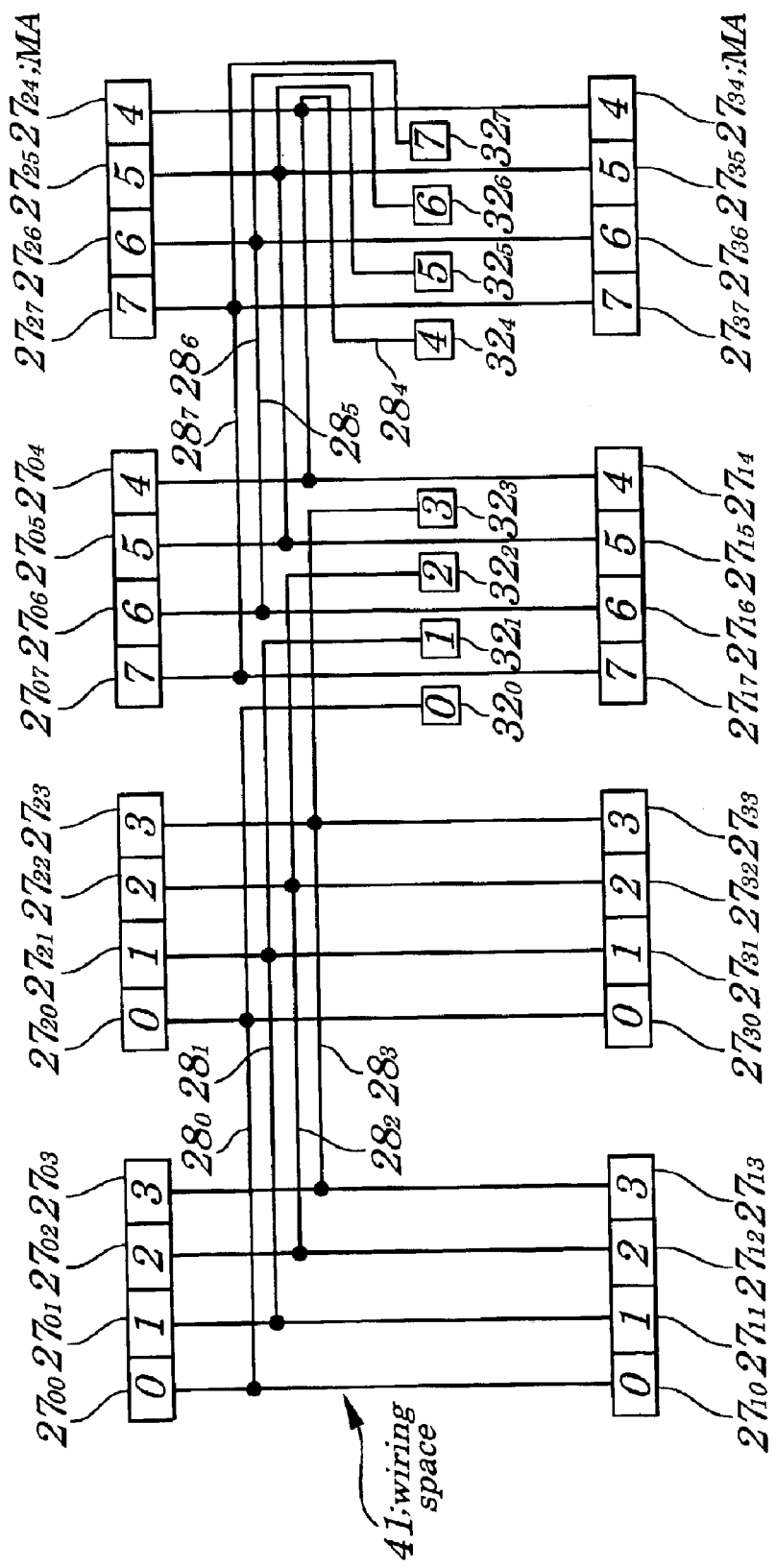
FIG. 2 is a partial expanded diagram of FIG. 1.
Figure 8:
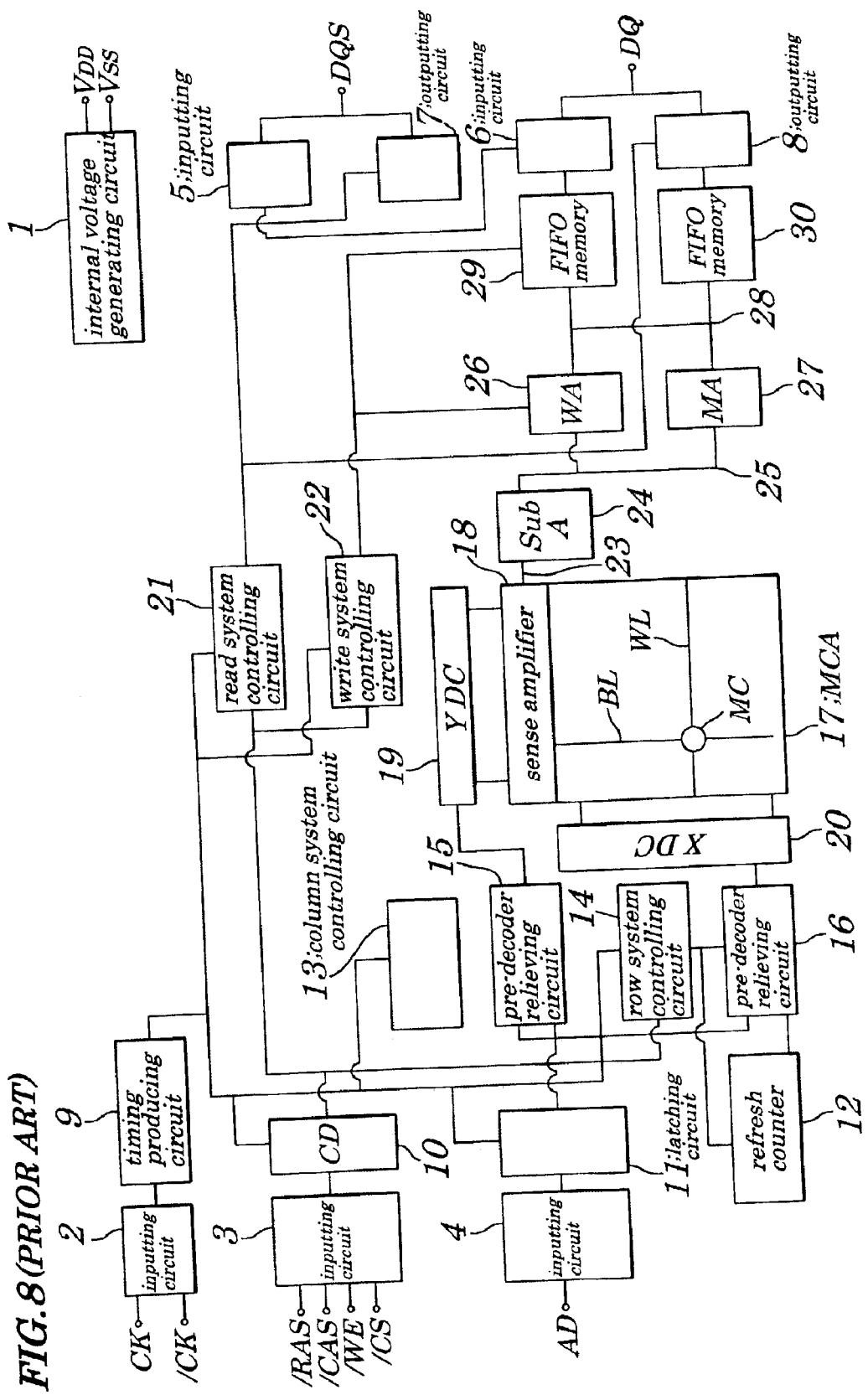
FIG. 8 is a schematic block diagram showing an example of configurations of a conventional semiconductor memory device.

FIG. 1 is a layout of a main portion showing an arrangement of circuits making up a semiconductor memory device according to a first embodiment of the present invention. FIG. 2 is a partial expanded diagram of FIG. 1. The semiconductor memory device of the first embodiment has same configurations as the conventional semiconductor memory device shown in FIG. 8 and therefore, in FIG. 1 and FIG. 2, same reference numbers are assigned to parts having same functions as the conventional semiconductor memory device shown in FIG. 8 and their descriptions are omitted accordingly.

The semiconductor memory device of the first embodiment has a memory capacity of 512 M bits and includes four banks and is of an 8-bit DQ configuration and 4-bit pre-fetch configuration.

In the semiconductor memory device of the first embodiment, a semiconductor chip is divided into two portions, one being a left portion and another being a right portion, and sub-banks $31_{0a}$, $31_{1a}$, $31_{2a}$, and $31_{3a}$ making up one of four pieces of banks $31_0$ to $31_3$ are sequentially arranged respectively in an upper left portion, lower left portion, upper right portion, and lower right portion in a left half of the semiconductor chip and sub-banks $31_{0b}$, $31_{1b}$, $31_{2b}$, $31_{3b}$ making up one of the four pieces of banks $31_0$ to $31_3$ are sequentially arranged respectively in an upper left portion, lower left portion, upper right portion, and lower right portion in a right half of the semiconductor chip. The semiconductor memory device also has eight pieces of DQ pads $32_0$ to $32_7$. Each of the sub-banks $31_{0a}$ and $31_{2a}$ has two pieces of MCAs (Memory Cell Arrays) 17 each having memory capacity of 32 M bits, one piece of a SubA (Sub-Amplifier) 24, and one piece of an XDC 20, and four pieces of MAs (Main Amplifiers) 27 or a like and two pieces of YDCs (column decoders) 19 are shared between the sub-banks $31_{0a}$ and $31_{2a}$. Likewise, each of the sub-banks $31_{1a}$ and $31_{3a}$ has two pieces of MCAs 17 each having memory capacity of 32 M bits, one piece of a SubA 24, and one piece of an XDC 20, and four pieces of MAs 27 or a like and two pieces of YDCs 19 are shared between the sub-banks $31_{1a}$ and $31_{3a}$. Each of the sub-banks $31_{0b}$ and $31_{2b}$ has two pieces of MCAs 17 each having memory capacity of 32 M bits, one piece of a SubA 24, and one piece of an XDC 20, and four pieces of MAs 27 or a like and two pieces of YDCs 19 are shared between the sub-banks $31_{0b}$ and $31_{2b}$. Each of the sub-banks $31_{1b}$ and $31_{3b}$ has two pieces of MCAs 17 each having memory capacity of 32 M bits, one piece of a SubA 24, and one piece of an XDC 20, and four pieces of MAs 27 or a like and two pieces of YDCs 19 are shared between the sub-banks $31_{1b}$ and $31_{3b}$.

Moreover, in FIGS. 1 and 2, each of numerals 0 to 7 written in each of rectangles for the MAs $27_{00}$ to $27_{07}$, MAs $27_{10}$ to $27_{17}$, MAs $27_{20}$ to $27_{27}$, MAs $27_{30}$ to $27_{37}$, and DQ pads $32_0$ to $32_7$ corresponds to numerical subscripts 0 to 7 of 8-bit DQ0 to DQ7 as in the case of a first digit numeral of subscripts of the MAs $27_{00}$ to $27_{07}$, MAs $27_{10}$ to $27_{17}$, MAs $27_{20}$ to $27_{27}$, MAs $27_{30}$ to $27_{37}$, and DQ pads $32_0$ to $32_7$ (see FIG. 14).

Also, the DQ pad $32_0$ to $32_7$ are arranged from the left to the right in increasing order of the numeral in each of the rectangles for the DQ pads $32_0$ to $32_7$. The MAs $27_{00}$ to $27_{03}$, MAs $27_{10}$ to $27_{13}$, MAs $27_{20}$ to $27_{23}$, and MAs $27_{30}$ to $27_{33}$ making up a total of eight pieces of MAs in each bank and being placed far from each of corresponding DQ pads $32_0$ to $32_3$ are arranged from the left to the right, as shown in FIG. 2, in increasing order of the numeral in each of the rectangles for the above sub-banks, as in the case of the DQ pads $32_0$ to $32_3$. On the other hand, the MAs $27_{04}$ to $27_{07}$, MAs $27_{14}$ to $27_{17}$, MAs $27_{24}$ to $27_{27}$, and MAs $27_{34}$ to $27_{37}$ making up the total of eight pieces of MAs 27 in each bank and being placed near to each of corresponding DQ pads $32_4$ to $32_7$ are arranged from the right to the left, as shown in FIG. 2, in increasing order of the numeral in each of the rectangles for the above sub-banks, in a manner that the numerals in the rectangles in each of the above sub-banks are symmetrical to numerals in the rectangles for the DQ pads $32_4$ to $32_7$. The global input and output lines $28_0$ to $28_3$ to connect each of the MAs $27_{00}$ to $27_{03}$, MAs $27_{10}$ to $27_{13}$, MAs $27_{20}$ to $27_{23}$, and MAs $27_{30}$ to $27_{33}$ to each of the corresponding DQ pads $32_0$ to $32_3$ are made up of first lines each connecting the MAs $27_{00}$ to $27_{03}$ and MAs $27_{10}$ to $27_{13}$, and MAs $27_{20}$ to $27_{23}$, faced opposing each other and MAs $27_{30}$ to $27_{33}$ faced opposing each other and L-shaped second lines each connecting each of the first lines to each of the corresponding DQ pads $32_0$ to $32_3$. On the other hand, the global input and output lines $28_4$ to $28_7$ to connect each of the MAs $27_{04}$ to $27_{07}$, MAs $27_{14}$ to $27_{17}$, MAs $27_{24}$ to $27_{27}$, and MA $27_{34}$ to MA$_{37}$ to each of the corresponding DQ pads $32_4$ to $32_7$ are made up of first lines each connecting the MAs $27_{04}$ to $27_{17}$ and MAs $27_{14}$ to $27_{17}$ faced opposing each other, and MAs $27_{24}$ to $27_{27}$ and MAs $27_{34}$ to $27_{37}$ faced opposing each other and second lines each connecting each of the first lines to each of the corresponding DQ pads $32_4$ to $32_7$. As shown in FIGS. 1 and 2, the second lines making up the above global input and output lines $28_4$ to $28_7$, in order to make a length of each of the second lines making up the global input and output lines $28_4$ to $28_7$ be equal to that of each of the second lines making up the global input and output lines $28_0$ to $28_3$, extend from a point of intersection of each of the second line and each of the corresponding first lines making up the second lines $28_4$ to $28_7$ from the left to the right through a wiring space 41 being placed in left and right directions in an approximately central portion of a semiconductor chip and, after having been extruded to a right side of the wiring space 41, extend downward and, further, after having extended to an approximately central portion in the wiring space 41 in a manner to turn back, again go down toward the corresponding DQ pads $32_4$ to $32_7$.

Figure 9:
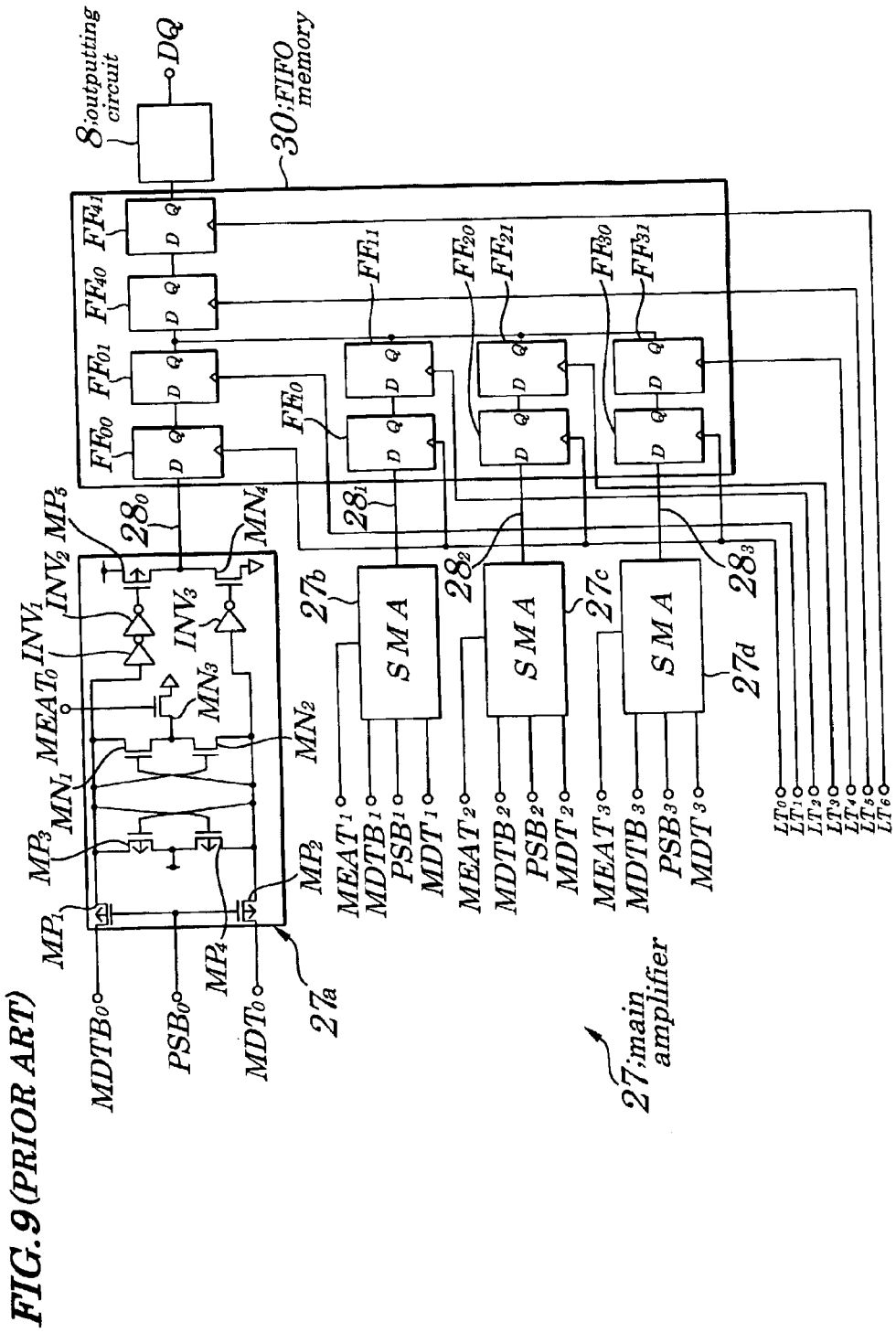
FIG. 9 is a schematic block diagram showing an example of configurations of an MA and a FIFO memory making up the conventional semiconductor memory device.
Figure 10:
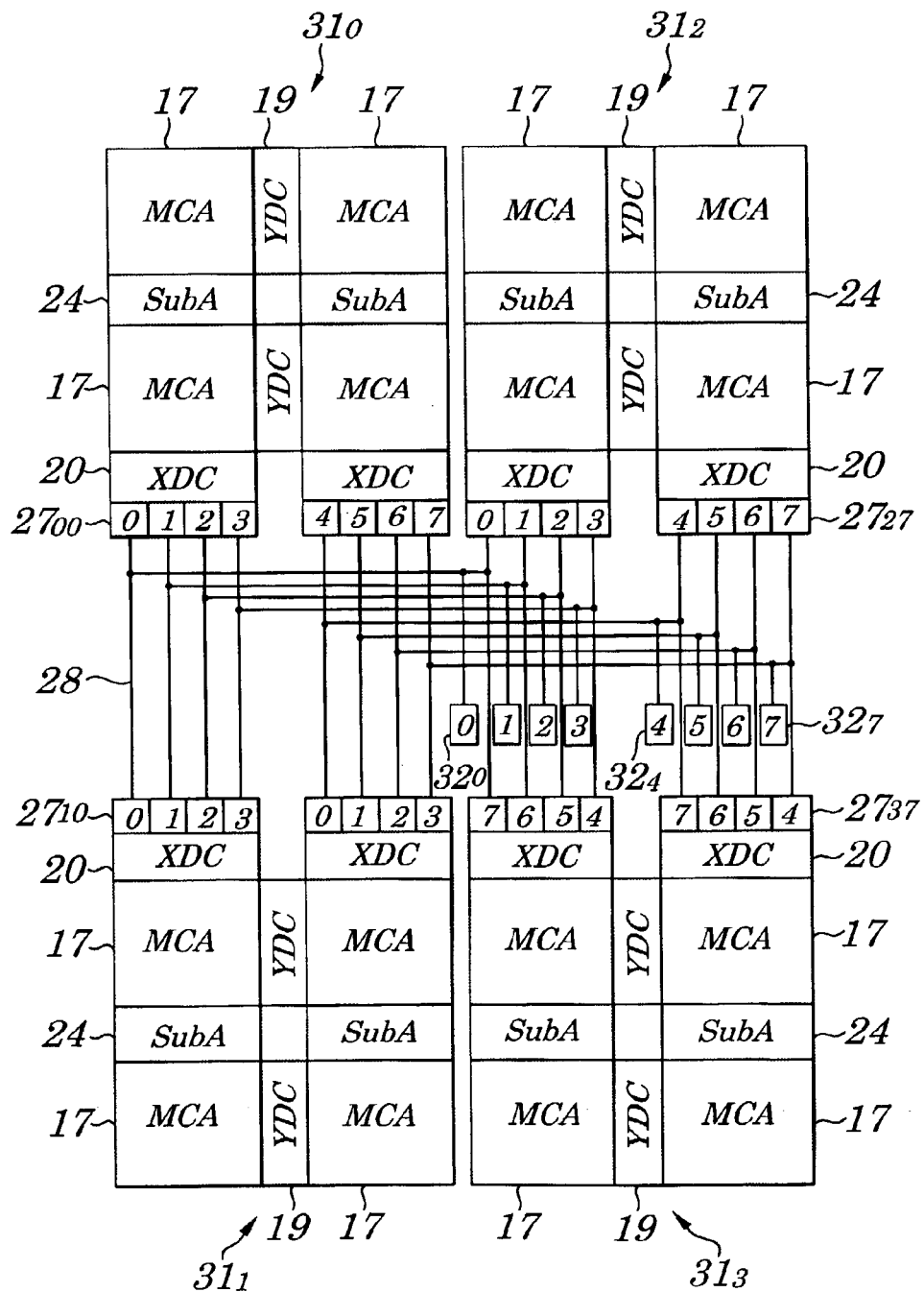
FIG. 10 is a layout of a main portion showing an arrangement of circuits making up a first conventional semiconductor memory device.
Figure 11:
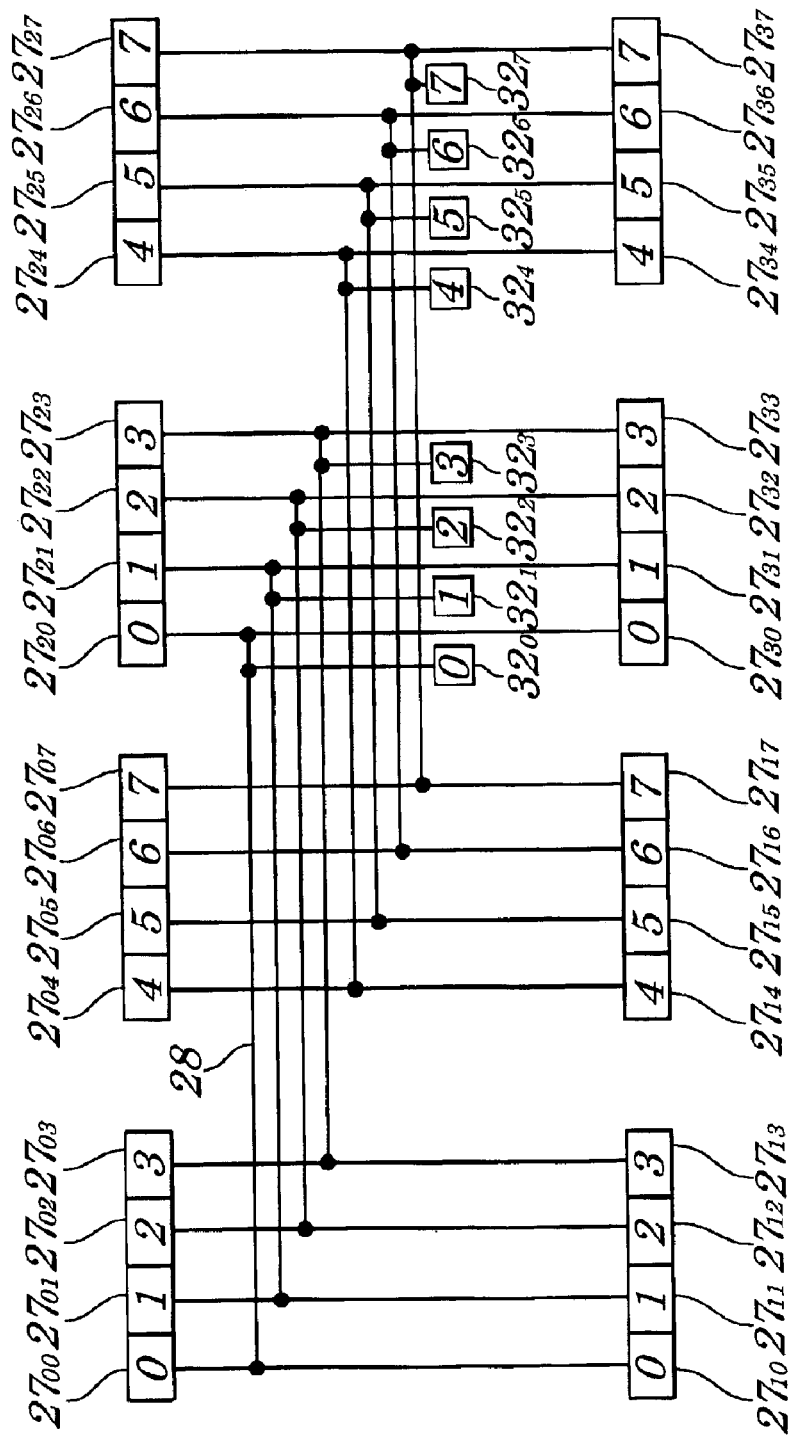
FIG. 11 is an expanded diagram of a portion in which the MA in each bank is connected to DQ pads through a global input and output line out of the layouts shown in FIG. 10.

In FIGS. 1 and 2, at time of reading data, data being stored in a selected memory cell in the MCA 17 is read from the selected memory cell and is amplified by a sense amplifier 18 and is transferred through a local input and output line 23 to the SubA 24 and, after having been amplified therein, is transferred through a main input and output line 25 to the MAs 27 and is again amplified therein and then reaches, through the global input and output line 28 and through a FIFO memory 30 and an outputting circuit 8, each of the corresponding DQ pads 32. Each of the MAs 27 of the first embodiment, as shown in FIG. 9, is made up of four pieces of the SMA $27_a$ to $27_d$ whose number corresponds to 4 bits to be pre-fetched, wherein 4-bit data, after having been amplified by each of the SMA $27_a$ to $27_d$, is transferred through the global input and output line $28_0$ to $28_3$ making up the global input and output line 28 to the FIFO memory 30. Since each of the global input and output lines 28 transfers 4-bit data, wiring using a total of 32 lines on a bit level is carried out in the wiring space 41 shown in FIGS. 1 and 2. However, since the wiring is carried out in a manner that the global input and output lines $28_0$ to $28_3$ are adjacent to the global input and output lines $28_4$ to $28_7$ in left and right directions, an area of the wiring space 41 is reduced to a half of that employed in the first conventional semiconductor memory device described above (see FIG. 11). Also, since the global input and output lines $28_4$ to $28_7$ return back at the right end of the wiring space 41, though there is a fear that 32 lines are placed in a concentrated manner at the right end of the wiring space 41, no problems occur because wiring using other lines is not carried out in this area. Moreover, in FIGS. 1 and 2, the FIFO memory 30 and the outputting circuit 8 placed between the global input and output line 28 and the DQ pads $32_0$ to $32_7$ shown in FIG. 9 are not shown.

As described above, in the semiconductor memory device of the first embodiment, out of a plurality of the MAs 27 corresponding to a plurality of the DQ pads 32 being arranged so as to meet specifications of standardization by the JEDEC (Joint Electron Device Engineering Council), the MAs 27 in numbers corresponding to a half of numbers of the DQ pads 32 are arranged in a manner that they are divided into two groups on a left side and a right side in the semiconductor chip. The MAs 27 belonging to a MA group being placed far from the DQ pads 32 are arranged in same order as the corresponding DQ pads 32 and the MAs 27 belonging to a MA group being placed near to the DQ pads 32 are arranged in order being symmetrical to the order in which the corresponding DQ pads 32 are arranged. Moreover, the global input and output lines 28 to connect the MAs 27 to the DQ pads 32 are arranged in the wiring space 41 in a distributed manner without being concentrated in certain places in each of the groups of MAs 27. Moreover, in order to make each of the global input and output lines 28 be same in length, wiring is carried out in a manner that the global input and output lines $28_0$ to $28_7$ being connected to the MAs 27 belonging to the MA group being placed near to the DQ pads $32_0$ to $32_7$ are turned back at a right end of the semiconductor chip.

By employing such the layout described above, since a total length of the wiring for the global input and output lines $28_0$ to $28_7$ can be made shorter and each of the global input and output lines 28 can be made same in length and since the banks $31_0$ to $31_3$ are arranged in a cluster, lines and circuits may be shared between the banks. Moreover, by employing such the layout, since each of the global input and output lines 28 between the MAs 27 and DQ pads $32_0$ to $32_7$ can be made same in length, the skew described above can be reduced from 3 ns in the conventional case to about 0.5 ns.

Second Embodiment

Figure 3:
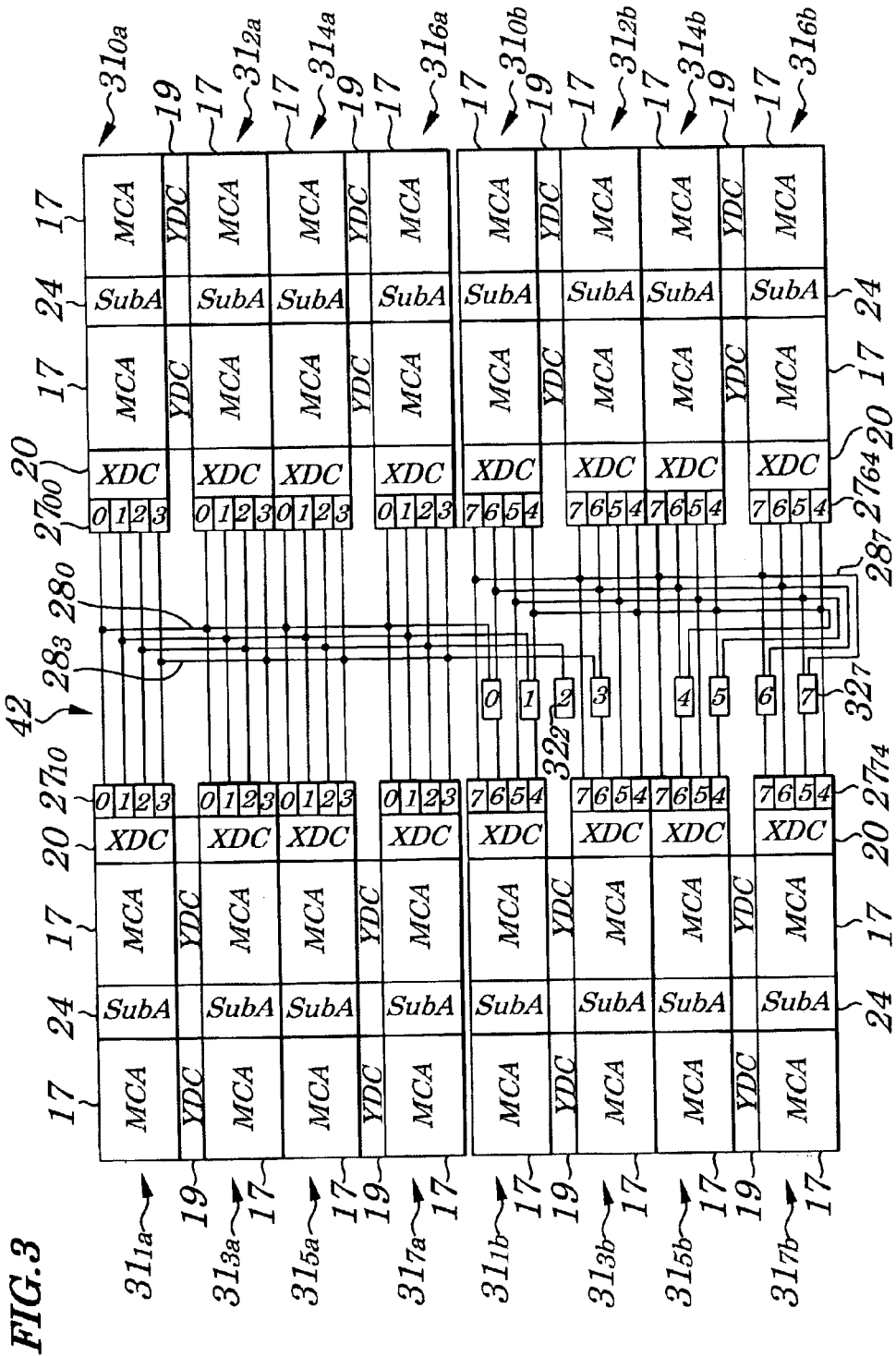
FIG. 3 is a layout of a main portion showing an arrangement of circuits making up a semiconductor memory device according to a second embodiment of the present invention.

FIG. 3 is a layout of a main portion showing an arrangement of circuits making up a semiconductor memory device according to a second embodiment of the present invention. The semiconductor memory device of the second embodiment has same configurations as the conventional semiconductor memory device shown in FIG. 8 and, therefore, in FIG. 3, same reference numbers are assigned to parts having same functions as the conventional semiconductor memory device shown in FIG. 8 and their descriptions are omitted accordingly. The semiconductor memory device of the second embodiment has a memory capacity of 512 M bits and includes eight pieces of banks and is of an 8-bit DQ and 4-bit pre-fetch structure. In the semiconductor memory device of the second embodiment, a semiconductor chip is divided into two portions, one being a left portion and another being a right portion and sub-banks $31_{0a}$, $31_{1a}$, $31_{2a}$, $31_{3a}$, $31_{4a}$, $31_{5a}$, $31_{6a}$, and $31_{7a}$ making up eight pieces of banks $31_0$ to $31_7$ are sequentially arranged respectively in an upper portion of a first column, a lower portion of the first column, an upper portion of a second column, a lower portion of the second column, an upper portion of a third column, a lower portion of the third column, an upper portion of a fourth column, and a lower portion of the fourth column in a left half of the semiconductor chip and the sub-banks $31_{0b}$, $31_{1b}$, $31_{2b}$, $31_{3b}$, $31_{4b}$, $31_{5b}$, $31_{6b}$, and $31_{7b}$ making up the eight pieces of the banks $31_0$ to $31_7$ are sequentially arranged respectively in an upper portion of a first column, a lower portion of the first column, an upper portion of a second column, a lower portion of the second column, an upper portion of a third column, a lower portion of the third column, an upper portion of a fourth column, and a lower portion of the fourth column in a right half of the semiconductor chip. The semiconductor memory device also has eight pieces of DQ pads $32_0$ to $32_7$. Each of the sub-banks $31_{0a}$ and $31_{2a}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{0a}$ and $31_{2a}$. Likewise, each of the sub-banks $31_{1a}$ and $31_{3a}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{1a}$ and $31_{3a}$. Each of the sub-banks $31_{4a}$ and $31_{6a}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{4a}$ and $31_{6a}$. Each of the sub-banks $31_{5a}$ and $31_{7a}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{5a}$ and $31_{7a}$.

Each of sub-banks $31_{0b}$ and $31_{2b}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{0b}$ and $31_{2b}$. Each of sub-banks $31_{1b}$ and $31_{3b}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{1b}$ and $31_{3b}$. Each of sub-banks $31_{4b}$ and $31_{6b}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{4b}$ and $31_{6b}$. Each of sub-banks $31_{5b}$ and $31_{7b}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{5b}$ and $31_{7b}$. Moreover, in FIG. 3, each of numerals 0 to 7 written in each of rectangles for the MAs $27_{00}$ to $27_{07}$, MAs $27_{10}$ to $27_{17}$, MAs $27_{20}$ to $27_{27}$, MAs $27_{30}$ to $27_{37}$, MAs $27_{40}$ to $27_{47}$, MAs $27_{50}$ to $27_{57}$, MAs $27_{60}$ to $27_{67}$, MAs $27_{70}$ to $27_{77}$, and DQ pads $32_0$ to $32_7$ corresponds to numerical subscripts 0 to 7 of the 8-bit DQ0 to DQ7 as in the case of a first digit numeral of subscripts of the MAs $27_{00}$ to $27_{07}$, MAs $27_{10}$ to $27_{17}$, MAs $27_{20}$ to $27_{27}$, MAs $27_{30}$ to $27_{37}$, MAs $27_{40}$ to $27_{47}$, MAs $27_{50}$ to $27_{57}$, MAs $27_{60}$ to $27_{67}$, MA $27_{70}$ to $27_{77}$, and DQ pads $32_0$ to $32_7$ (see FIG. 14).

Also, the DQ pad $32_0$ to $32_7$ are arranged from the left to the right in increasing order of the numeral in each of the rectangles for the DQ pad $32_0$ to $32_7$. The MAs $27_{00}$ to $27_{03}$, MAs $27_{10}$ to $27_{13}$, MAs $27_{20}$ to $27_{23}$, MAs $27_{30}$ to $27_{33}$, MAs $27_{40}$ to $27_{43}$, MAs $27_{50}$ to $27_{53}$, MAs $27_{60}$ to $27_{63}$, and MAs $27_{70}$ to $27_{73}$ making up a total of eight pieces of MAs 27 in each bank and being placed far from each of corresponding DQ pads $32_0$ to $32_3$ are arranged from the left to the right, as shown in FIG. 3, in increasing order of the numeral in each of the rectangles for the above sub-banks, as in the case of the DQ pad $32_0$ to $32_3$. On the other hand, the MAs $27_{04}$ to $27_{07}$, MAs $27_{14}$ to $27_{17}$, MAs $27_{24}$ to $27_{27}$, MAs $27_{34}$ to $27_{37}$, MAs $27_{44}$ to $27_{47}$, MAs $27_{54}$ to $27_{57}$, MAs $27_{64}$ to $27_{67}$, and MAs $27_{74}$ to $27_{77}$ making up the total of eight pieces of MAs 27 in each bank and being placed near to each of corresponding DQ pads $32_4$ to $32_7$ are arranged from the right to the left, as shown in FIG. 3, in increasing order of the numeral in each of the rectangles for the above sub-banks, in a manner that the numerals in the rectangles in each of the above sub-banks are symmetrical to numerals in the rectangles for the DQ pads $32_4$ to $32_7$. Global input and output lines $28_0$ to $28_3$ to connect each of the MAs $27_{00}$ to $27_{03}$, MAs $27_{10}$ to $27_{13}$, MAs $27_{20}$ to $27_{23}$, MAs $27_{30}$ to $27_{33}$, MAs $27_{40}$ to $27_{43}$, MAs $27_{50}$ to $27_{53}$, MAs $27_{60}$ to $27_{63}$, and MAs $27_{70}$ to $27_{73}$ to each of the corresponding DQ pads $32_0$ to $32_3$ are made up of first lines each connecting the MAs $27_{00}$ to $27_{03}$, MAs $27_{10}$ to $27_{13}$, MAs $27_{20}$ to $27_{23}$, MAs $27_{30}$ to $27_{33}$, MAs $27_{40}$ to $27_{43}$, MAs $27_{50}$ to $27_{53}$, MAs $27_{60}$ to $27_{63}$, and MAs $27_{70}$ to $27_{73}$, faced opposing one other and L-shaped second lines each connecting each of the first lines to each of the corresponding DQ pads $32_0$ to $32_3$. On the other hand, the global input and output lines $28_4$ to $28_7$ to connect each of the MAs $27_{04}$ to $27_{07}$, MAs $27_{14}$ to $27_{17}$, MAs $27_{24}$ to $27_{27}$, MAs $27_{34}$ to $MA_{37}$, MAs $27_{44}$ to $27_{47}$, MAs $27_{54}$ to $27_{57}$, MAs $27_{64}$ to $27_{67}$, and MAs $27_{74}$ to $27_{77}$ to each of the corresponding DQ pads $32_4$ to $32_7$ are made up of first lines each connecting MAs $27_{04}$ to $27_{07}$, MAs $27_{14}$ to $27_{17}$, MAs $27_{24}$ to $27_{27}$, MAs $27_{34}$ to $27_{37}$, MAs $27_{44}$ to $27_{47}$, MAs $27_{54}$ to $27_{57}$, MAs $27_{64}$ to $27_{67}$, and MAs $27_{74}$ to $27_{77}$ faced opposing one another and second lines each connecting each of the first lines to each of the corresponding DQ pads $32_4$ to $32_7$. The second lines making up the above global input and output lines $28_4$ to $28_7$, in order to make a length of each of the second line making up the global input and output lines $28_4$ to $28_7$ be equal to that of each of the second line making up the global input and output lines $28_0$ to $28_3$, extend from a point of intersection of each of the second line and each of the corresponding first lines making up the global input and output lines $28_4$ to $28_7$ from the left to the right through a wiring space 42 being placed in left and right directions in an approximately central portion of a semiconductor chip and, after having been extruded to a right side of the wiring space 42, extends downward and, further, after having extended to an approximately central portion in the wiring space 42 in a manner to turn back, again go down toward corresponding DQ pads $32_4$ to $32_7$.

In FIG. 3, at time of reading data, data being stored in a selected memory cell in the MCA 17 is read from the memory cell and is amplified by a sense amplifier 18 and is transferred through a local input and output line 23 to the SubA 24 and, after having been amplified therein, is transferred through a main input and output line 25 to the MAs 27 and is again amplified therein and then reaches, through the global input and output line 28 and through a FIFO memory 30 and an outputting circuit 8, each of the corresponding DQ pads 32. Each of the MAs 27 of the second embodiment, as shown in FIG. 9, is made up of four pieces of the MAs $27_a$ to $27_d$ whose number corresponds to 4 bits to be pre-fetched, wherein 4-bit data, after having been amplified by each of the SMA $27_a$ to $27_d$, is transferred through the global input and output line $28_0$ to $28_3$ making up the global input and output line 28 to the FIFO memory 30.

Since each of the global input and output lines 28 transfers 4-bit data and since one piece of a line making up the global lines 28 is made up of four sub-lines tied in a bundle, wiring using a total of 32 lines on a bit level is carried out in the wiring space 42 shown in FIG. 3. However, since the wiring is carried out in a manner that, except a portion where the global input and output lines $28_0$ to $28_3$ and the global input and output lines $28_0$ to $28_3$ partially overlap one another, the global input and output lines $28_0$ to $28_3$ are adjacent to the global input and output lines $28_4$ to $28_7$ in left and right directions, an area of the wiring space 42 is reduced compared with the area used in the first conventional semiconductor memory device described above (see FIG. 11). In an upper portion of the DQ pads $32_0$ to $32_3$, a number of the global input and output lines 28 becomes 27 on a bit level. Also, since the global input and output lines $28_4$ to $28_7$ return back at the right end of the wiring space 42, though there is a fear that 32 lines are placed in a concentrated manner at the right end of the wiring space 42, no problems occur because wiring using other lines is not carried out in this area. Moreover, in FIG. 3, the FIFO memory 30 and the outputting circuit 8 placed between the global input and output line 28 and the DQ pads $32_0$ to $32_7$ shown in FIG. 9 are not shown.

As described above, in the semiconductor memory device of the second embodiment, out of a plurality of the MAs 27 corresponding to a plurality of the DQ pads 32 being arranged so as to meet specifications of standardization by the JEDEC (Joint Electron Device Engineering Council), the MAs 27 in numbers corresponding to a half of numbers of the DQ pads 32 are arranged in a manner that they are divided into two groups on a left side and a right side in the semiconductor chip. The MAs 27 belonging to a MA group being placed far from the DQ pads 32 are arranged in same order as the corresponding DQ pads 32 and the MAs 27 belonging to a MA group being placed near to the DQ pads 32 are arranged in order being symmetrical to the order in which the corresponding DQ pads 32 are arranged. Moreover, the global input and output lines 28 to connect the MAs 27 to the DQ pads 32 are arranged in the wiring space 42 in a distributed manner without being concentrated in certain places in each of the groups of the MAs 27. Furthermore, in order to make each of the global input and output lines 28 be same in length, wiring is carried out in a manner that the global input and output lines 28 being connected to the MAs 27 belonging to the MA group being placed near to the DQ pad 32 turn back at a right end of the semiconductor chip.

If the first conventional semiconductor memory device described above is applied to the semiconductor memory device which has eight pieces of banks, since a total of a wiring length of the global input and output lines 28 is expected to increase from about 6 mm to about 9 mm, and skew caused by the increase in the wiring length is expected to increase from about 3 ns to about 4 ns. However, by employing the layout of the second embodiment, since a difference in length of the global input and output lines 28 between banks is small, the skew can be reduced to about 1.0 ns.

Third Embodiment

Figure 4:
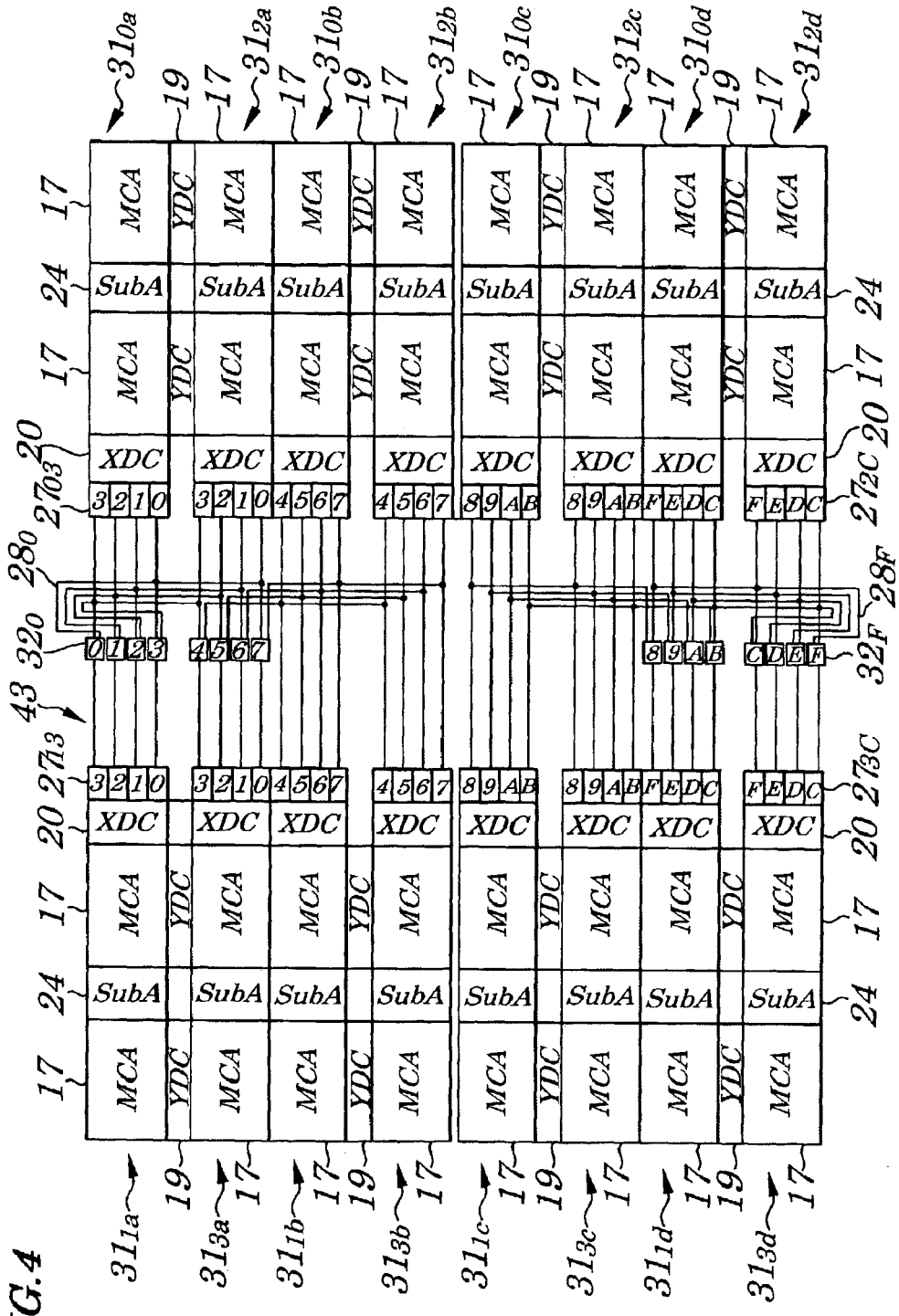
FIG. 4 is a layout of a main portion showing an arrangement of circuits making up a semiconductor memory device according to a third embodiment of the present invention.

FIG. 4 is a layout of a main portion showing an arrangement of circuits making up a semiconductor memory device according to a third embodiment of the present invention. The semiconductor memory device of the third embodiment has same configurations as the conventional semiconductor memory device shown in FIG. 8 and, therefore, in FIG. 4, same reference numbers are assigned to parts having same functions as the conventional semiconductor memory device shown in FIG. 8 and their descriptions are omitted accordingly. The semiconductor memory device of the third embodiment has a memory capacity of 512 M bits and includes four pieces of banks and is of a 16-bit DQ configuration and 4-bit pre-fetch configuration. In the semiconductor memory device of the third embodiment, a semiconductor chip is divided into two portions, one being a left portion and another being a right portion, and sub-banks $31_{0a}$, $31_{1a}$, $31_{2a}$, and $31_{3a}$ making up four pieces of banks $31_0$ to $31_7$ are sequentially arranged respectively in an upper left portion of a first column, a lower left portion of the first column, an upper right portion of the first column, and a lower right portion of the first column, and sub-banks $31_{0b}$, $31_{1b}$, $31_{2b}$, and $31_{3b}$ are sequentially arranged respectively in an upper left portion of a second column, a lower left portion of the second column, an upper right portion of the second column, a lower right portion of the second column, sub-banks $31_{0c}$, $31_{1c}$, $31_{2c}$, and $31_{3c}$ are sequentially arranged respectively in an upper left portion of a third column, a lower left portion of the third column, an upper right portion of the third column, and a lower right portion of the third column, and sub-banks $31_{0d}$, $31_{1d}$, $31_{2d}$, and $31_{3d}$ are sequentially arranged respectively in an upper left portion of a fourth column, a lower left portion of the fourth column, an upper right portion of the fourth column, a lower right portion of the fourth column. The semiconductor memory device also has 16 pieces of DQ pads $32_0$ to $32_F$. Here, a subscript of the DQ pad 32 and a subscript of the MA 27 are hexadecimal.

Each of the sub-banks $31_{0a}$ and $31_{2a}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{0a}$ and $31_{2a}$. Likewise, each of the sub-banks $31_{1a}$ and $31_{3a}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{1a}$ and $31_{3a}$. Each of the sub-banks $31_{0b}$ and $31_{2b}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{0b}$ and $31_{2b}$. Each of the sub-banks $31_{1b}$ and $31_{3b}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{1b}$ and $31_{3b}$.

Each of the sub-banks $31_{0c}$ and $31_{2c}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{0c}$ and $31_{2c}$. Each of the sub-banks $31_{1c}$ and $31_{3c}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{1c}$ and $31_{3c}$. Each of the sub-banks $31_{0d}$ and $31_{2d}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{0d}$ and $31_{2d}$. Each of the sub-banks $31_{1d}$ and $31_{3d}$ has two pieces of MCAs 17 each having memory capacity of 16 M bits, one piece of a SubA 24, and one piece of an XDC 20, and four pieces of MAs 27 or a like, and two pieces of YDCs 19 are shared between the sub-banks $31_{1d}$ and $31_{3d}$. Moreover, in FIG. 4, each of hexadecimals 0 to F written in each of rectangles for the MAs $27_{00}$ to $27_{0F}$, MAs $27_{10}$ to $27_{1F}$, MAs $27_{20}$ to $27_{2F}$, MAs $27_{30}$ to $27_{3F}$, and DQ pads $32_0$ to $32_F$ corresponds to subscripts 0 to F of 16-bit DQ0 to DQF as in the case of a first digit numeral of subscripts of the MAs $27_{00}$ to $27_{0F}$, MAs $27_{10}$ to $27_{1F}$, MAs $27_{20}$ to $27_{2F}$, MAs $27_{30}$ to $27_{3F}$, and DQ pads $32_0$ to $32F$ (in FIG. 14, DQ0 to DQ15 are used).

Also, the DQ pads $32_0$ to $32_F$ are arranged from the left to the right in increasing order of the numeral in each of the rectangles for the DQ pads $32_0$ to $32_F$. The MAs $27_{00}$ to $27_{03}$, MAs $27_{0C}$ to $27_{0F}$, MAs $27_{10}$ to $27_{13}$, MAs $27_{1C}$ to $27_{1F}$, MAs $27_{20}$ to $27_{23}$, MAs $27_{2C}$ to $27_{2F}$, MAs $27_{30}$ to $27_{33}$, and MAs $27_{3C}$ to $27_{3F}$ making up a total of 16 pieces of MAs 27 in each bank and being placed near to each of corresponding DQ pads $32_0$ to $32_3$ and $32_0$ to $32_F$ are arranged from the right to the left, as shown in FIG. 4, in a manner that the numerals in the rectangles in each of the above sub-banks are symmetrical to numerals in the rectangles for the DQ pads $32_4$ to $32_7$ and $32_0$ to $32_F$. The MAs $27_{04}$ to $27_{07}$, MAs $27_{08}$ to $27_{0B}$, MAs $27_{14}$ to $27_{17}$, MAs $27_{18}$ to $27_{1B}$, MAs $27_{24}$ to $27_{27}$, MAs $27_{31}$ to $27_{3B}$, MAs $27_{34}$ to $27_{37}$, and MAs $27_{38}$ to $27_{3B}$ being placed far from each of corresponding DQ pads $32_4$ to $32_7$ and $32_8$ to $32_B$ are arranged from the left to the right, which is a same arrangement order as the DQ pads $32_4$ to $32_7$ and $32_0$ to $32_B$.

The global input and output lines $28_4$ to $28_B$ to connect each of the MAs $27_{04}$ to $27_{0B}$, MAs $27_{14}$ to $27_{1B}$, MAs $27_{24}$ to $27_{2B}$, and MAs $27_{34}$ to $27_{31}$ to each of the corresponding DQ pads $32_4$ to $32_0$ are made up of first lines each connecting the MAs $27_{04}$ to $27_{0B}$, MAs $27_{14}$ to $27_{1B}$, MAs $27_{24}$ to $27_{2B}$, and MAs $27_{34}$ to $27_{3B}$ faced opposing one other and L-shaped second lines each connecting each of the first lines to each of the corresponding DQ pads $32_4$ to $32_B$ in the wiring space 43.

On the other hand, the global input and output lines $28_0$ to $28_3$ to connect each of the MAs $27_{00}$ to $27_{03}$, MAs $27_{10}$ to $27_{13}$, MAs $27_{20}$ to $27_{23}$, and MAs $27_{30}$ to $27_{33}$ to corresponding DQ pads $32_0$ to $32_3$ are made up of first lines each connecting the MAs $27_{00}$ to $27_{03}$, MAs $27_{10}$ to $27_{13}$, MAs $27_{20}$ to $27_{23}$, and MAs $27_{30}$ to $27_{33}$ faced opposing one other and L-shaped second lines each connecting each of the first lines to each of the corresponding DQ pads $32_0$ to $32_3$ in a wiring space 43. The second lines making up the above global input and output lines $28_0$ to $28_3$, in order to make a length of each of the second lines making up the global input and output lines $28_4$ to $28_7$ be equal to that of each of the second line making up the global input and output lines $28_0$ to $28_3$, extend from a point of intersection of each of the second line and each of the corresponding first lines making up the second lines $28_0$ to $28_3$ from the right to the left through the wiring space 43 being placed in left and right directions in an approximately central portion of the semiconductor chip and, after having been extruded to a left side of the wiring space 43, extend downward and, further, after having extended to an approximately central portion in the wiring space 43 in a manner so as to turn back, again go down toward the corresponding DQ pads $32_0$ to $32_3$.

Moreover, the global input and output lines $28_C$ to $28_F$ to connect each of the MAs $27_{0C}$ to $27_{0F}$, MAs $27_{1C}$ to $27_{1F}$, MAs $27_{2C}$ to $27_{2F}$, and MAs $27_{3C}$ to $27_{3F}$ to each of the corresponding DQ pads $32_C$ to $32_F$ are made up of first lines each connecting the MAs $27_{0C}$ to $27_{0F}$, MAs $27_{1C}$ to $27_{1F}$, MAs $27_{2C}$ to $27_{2F}$, and MAs $27_{3C}$ to $27_{3F}$ faced opposing one another and second lines each connecting each of the first lines to each of the corresponding DQ pads $32_C$ to $32_F$ in the wiring space 43. The second lines making up the above global input and output lines $28_C$ to $28_F$, in order to make a length of each of the second lines making up the global input and output lines $28_8$ to $28_B$ be equal to that of each of the second line making up the global input and output lines $28_C$ to $28_F$, extend from a point of intersection of each of the second line and each of the corresponding first lines making up the global input and output lines $28_C$ to $28_F$ from the left to the right through the wiring space 43 being placed in left and right directions in an approximately central portion of a semiconductor chip and, after having been extruded to a right side of the wiring space 43, extend downward and, further, after having extended to an approximately central portion in the wiring space 43 in a manner so as to turn back, again go down toward corresponding DQ pads $32_C$, to $32_F$.

In FIG. 4, at time of reading data, data being stored in a selected memory cell in the MCA 17 is read from the memory cell and is amplified by a sense amplifier 18 and is transferred through a local input and output line 23 to the SubA 24 and, after having been amplified therein, is again transferred through a main input and output line 25 to the MAs 27 and is amplified therein and then reaches, through the global input and output line 28 and through a FIFO memory 30 and an outputting circuit 8, each of the corresponding DQ pads 32. Each of the MAs 27 of the embodiment, as shown in FIG. 9, is made up of four pieces of the MAs $27_a$ to $27_d$ whose number corresponds to 4 bits to be pre-fetched, wherein 4-bit data, after having been amplified by each of the MAs $27_a$ to $27_d$, is transferred through the global input and output line $28_0$ to $28_F$ making up the global input and output line 28 to the FIFO memory 30.

Since each of the global input and output lines 28 transfers 4-bit data and since one piece of a line making up the global lines 28 is made up of four sub-lines tied in a bundle, wiring using a total of 32 lines on a bit level is carried out in the wiring space 43 shown in FIG. 4. However, since wiring is carried out in a manner that the global input and output lines $28_0$ to $28_3$ are adjacent to the global input and output lines $28_4$ to $28_7$ in left and right directions and since wiring is carried out in a manner that the global input and output lines $28_8$ to $28_B$ are adjacent to the global input and output lines $28_C$ to $28_F$ in left and right directions, a number of lines of the global input and output lines 28 in the wiring space 43 on a bit level is 16, which does not cause an increase in an area of the wiring space 43. Moreover, since the global input and output lines 28 return back at both ends of the wiring space 43, though there is a fear that 32 lines are placed in a concentrated manner at both the ends of the wiring space 43, no problems occur because wiring using other lines is not carried out in this area. Moreover, in FIG. 4, the FIFO memory 30 and the outputting circuit 8 placed between the global input and output line 28 and the DQ pads $32_0$ to $32_F$ shown in FIG. 9 are not shown.

As described above, in the semiconductor memory device of the third embodiment, out of a plurality of the MAs 27 corresponding to a plurality of the DQ pads 32 being arranged so as to meet specifications of standardization by the JEDEC (Joint Electron Device Engineering Council), the MAs 27 in numbers corresponding to a half of numbers of the DQ pads 32 are arranged in a manner that they are divided into two groups on a left side and a right side in the semiconductor chip. The MAs 27 belonging to a MA group being placed far from the DQ pads 32 are arranged in same order as the corresponding DQ pads 32 and the MAs 27 belonging to a MA group being placed near to the DQ pads 32 are arranged in order being symmetrical to the order in which the corresponding DQ pads 32 are arranged. Moreover, the global input and output lines 28 to connect the MAs 27 to the DQ pads 32 are arranged in the wiring space 43 in a distributed manner without being concentrated in certain places in each of the groups of the MAs 27. Furthermore, in order to make the global input and output lines 28 be same in length, wiring is carried out in a manner that the global input and output lines 28 being connected to the MAs 27 belonging to the MA group being placed near to the DQ pad are turned back at the right end and at the left end of the semiconductor chip.

If the first conventional semiconductor memory device described above is applied to the semiconductor memory device which is so constructed that the DQ pads $32_0$ to $32_F$ are placed on both ends of the wiring space 43 and has a large capacity (1 to 2 G bits), since a total of a wiring length of the global input and output lines 28 is expected to increase and skew caused by the increase in the wiring length and an area of the semiconductor chip are expected to increase. However, by employing the layout of the third embodiment, since no increase occurs in a total length of the global input and output line 28, the skew can be reduced.

Fourth Embodiment

Figure 5:
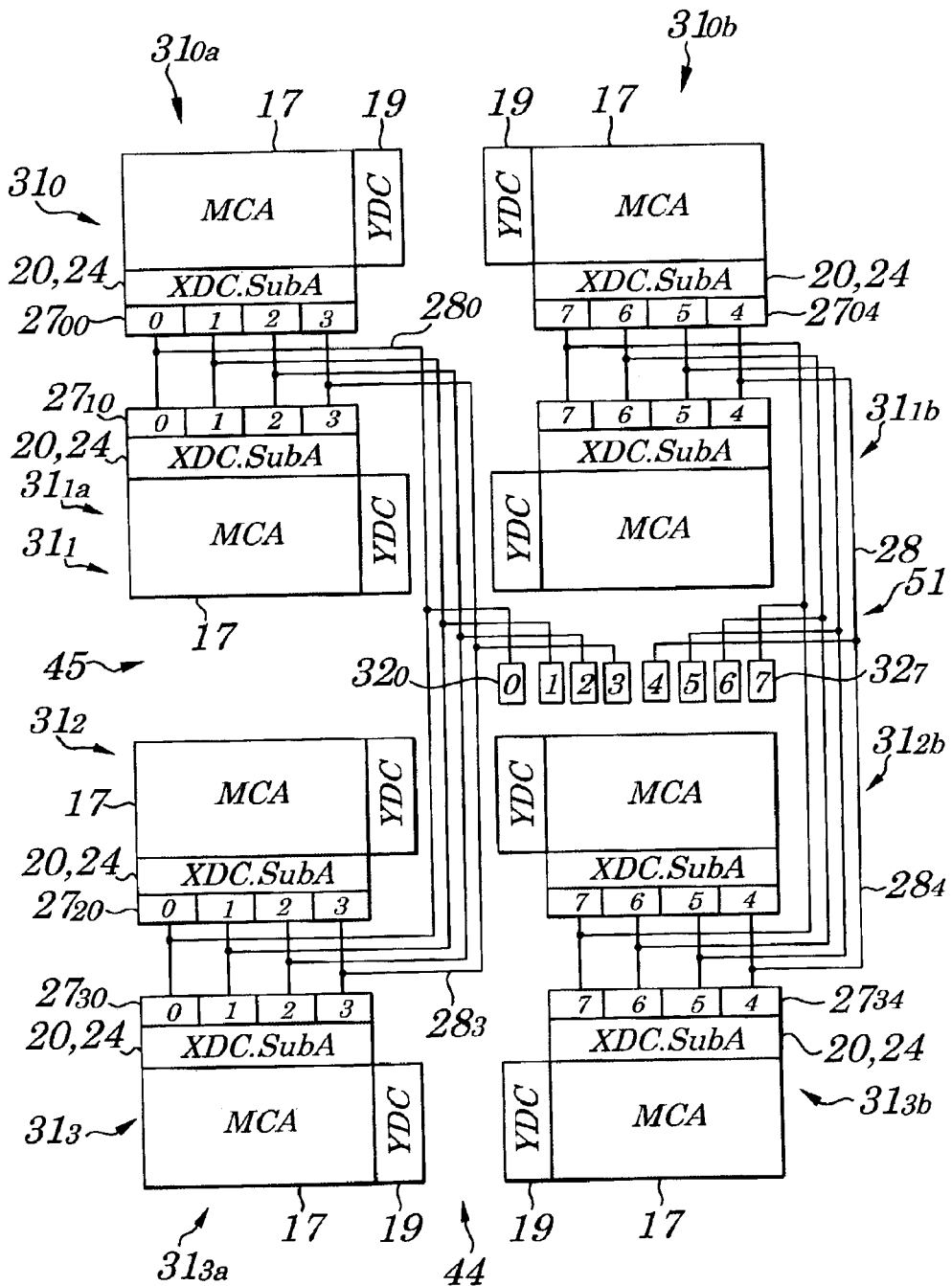
FIG. 5 is a layout of a main portion showing an arrangement of circuits making up a semiconductor memory device according to a fourth embodiment of the present invention.

FIG. 5 is a layout of a main portion showing an arrangement of circuits making up a semiconductor memory device according to a fourth embodiment of the present invention. The semiconductor memory device of the fourth embodiment has same configurations as the conventional semiconductor memory device shown in FIG. 8 and, therefore, in FIG. 5, same reference numbers are assigned to parts having same functions as the conventional semiconductor memory device shown in FIG. 8 and their descriptions are omitted accordingly. The semiconductor memory device of the fourth embodiment has a wiring region 51 of about 20 $\mu$m for a global input and output line 28 at a right end of its semiconductor chip. The semiconductor memory device of the fourth embodiment has a memory capacity of 512 M bits and includes four pieces of banks and is of an 8-bit DQ and 4-bit pre-fetch structure. The semiconductor memory device of the fourth embodiment is made up of four pieces of banks $31_0$ to $31_3$ being sequentially arranged in up and down directions in a semiconductor chip and of eight pieces of DQ pads $32_0$ to $32_7$. Each of the sub-banks $31_{0a}$, $31_{1a}$, $31_{2a}$, and $31_{3a}$, and the sub-banks $31_{0b}$, $31_{1b}$, $31_{2b}$, and $31_{3b}$ making up each of banks $31_0$ to $31_3$ has memory capacity of 64 M bits, one piece of an MCS 17, one set of an XDC 20 and SubA 24, one piece of a YDC 19, four pieces of MAs 27, or a like.

Moreover, the DQ pads $32_0$ to $32_7$ are arranged from the left to the right. MAs $27_{00}$ to $27_{03}$, MAs $27_{10}$ to $27_{13}$, MAs $27_{20}$ to $27_{23}$, and MAs $27_{30}$ to $27_{33}$ making up each of the sub-banks $31_{01}$, $31_{1a}$, $31_{2a}$, and $31_{3a}$ being placed far from corresponding DQ pads $32_0$ to $32_3$ are arranged in a lower portion of the corresponding MCA 17 in same arrangement order as the DQ pads $32_0$ to $32_3$ from the left to the right. On the other hand, MAs $27_{04}$ to $27_{07}$, MAs $27_{14}$ to $27_{17}$, MAs $27_{24}$ to $27_{27}$, and MAs 34 to $27_{37}$ making up each of the sub-banks $31_{0b}$, $31_{1b}$, $31_{2b}$, and $31_{3b}$ being placed near to corresponding DQ pads $32_4$ to $32_7$ are arranged in a lower portion of the corresponding MCA 17 in arrangement order being symmetrical to order in which the DQ pads $32_0$ to $32_3$ are arranged, from the right to the left. Moreover, in FIG. 5, a FIFO memory 30 (not shown) and an outputting circuit 8 (not shown) placed between the global input and output line 28 and the DQ pads $32_0$ to $32_F$ shown in FIG. 9 are not shown.

The global input and output lines $28_0$ to $28_3$ to connect each of the MAs $27_{01}$ to $27_{03}$, MAs $27_{10}$ to $27_{13}$, MAs $27_{20}$ to $27_{23}$, and MAs $27_{30}$ to $27_{33}$ to each of the corresponding DQ pads $32_0$ to $32_3$ are made up of first lines each connecting the MAs $27_{00}$ to $27_{03}$, MAs $27_{10}$ to $27_{13}$, MAs $27_{20}$ to $27_{23}$, and MAs $27_{30}$ to $27_{33}$ faced opposing one other, second lines one end of each of which is connected to each of the corresponding first line and being placed toward approximately a central portion of the semiconductor chip and being placed toward an approximately central portion of wiring space positioned in up and down directions in the approximately central portion of the semiconductor chip and L-shaped third lines one end of each of which is connected to each of the corresponding second lines and another end of each of which is connected to each of corresponding DQ pads $32_0$ to $32_3$ being placed on a right side in FIG. 5 in a wiring space 45 being positioned in left and right directions in the approximately central portion of the semiconductor chip.

On the other hand, the global input and output lines $28_4$ to $28_7$ to connect each of the MAs $27_{04}$ to $27_{07}$, MAs $27_{14}$ to $27_{17}$, MAs $27_{24}$ to $27_{27}$, and MAs $27_{34}$ to $27_{37}$ to each of the corresponding DQ pads $32_4$ to $32_7$ are made up of first lines each connecting the MAs $27_{04}$ to $27_{07}$, MAs $27_{14}$ to $27_{17}$, MAs $27_{24}$ to $27_{27}$, and MAs $27_{34}$ to $27_{37}$ faced opposing one other, second lines each connecting each of the first lines to each of the corresponding DQ pads $32_4$ to $32_7$. The second lines making up the above global input and output lines $28_4$ to $28_7$, in order to make a length of each of the second lines making up the global input and output lines $28_0$ to $28_3$ be equal to that of each of the second lines making up the global input and output lines $28_4$ to $28_3$, extend from a point of intersection of each of the second line and each of the corresponding first lines making up the global input and output lines $28_4$ to $28_7$ to a right end of the semiconductor chip and further extend toward an approximately central portion of the wiring region 51 being placed in up and down directions in the upper portion of the semiconductor chip and are connected to the corresponding DQ pads $32_4$ to $32_7$ being placed on a right side in FIG. 5 in the wiring space 45 being positioned in up and down directions in an approximately central portion of the semiconductor chip.

In FIG. 5, at time of reading data, data being stored in a selected memory cell in the MCA 17 is read from the memory cell and is amplified by a sense amplifier 18 (not shown) and is transferred through a local input and output line 23 to a SubA 24 and, after having been amplified therein, is transferred through a main input and output line 25 to the MAs 27 and is again amplified therein and then reaches, through the global input and output line 28 and through a FIFO memory 30 and an outputting circuit 8, each of the corresponding DQ pads 32. Each of the MAs 27 of the fourth embodiment, as shown in FIG. 9, is made up of four pieces of the MAs $27_a$ to $27_d$ whose number corresponds to 4 bits to be pre-fetched, wherein 4-bit data, after having been amplified by each of the SMA $27_a$ to $27_d$, is transferred through the global input and output line $28_0$ to $28_7$ making up the global input and output line 28 to the FIFO memory 30.

Figure 12:
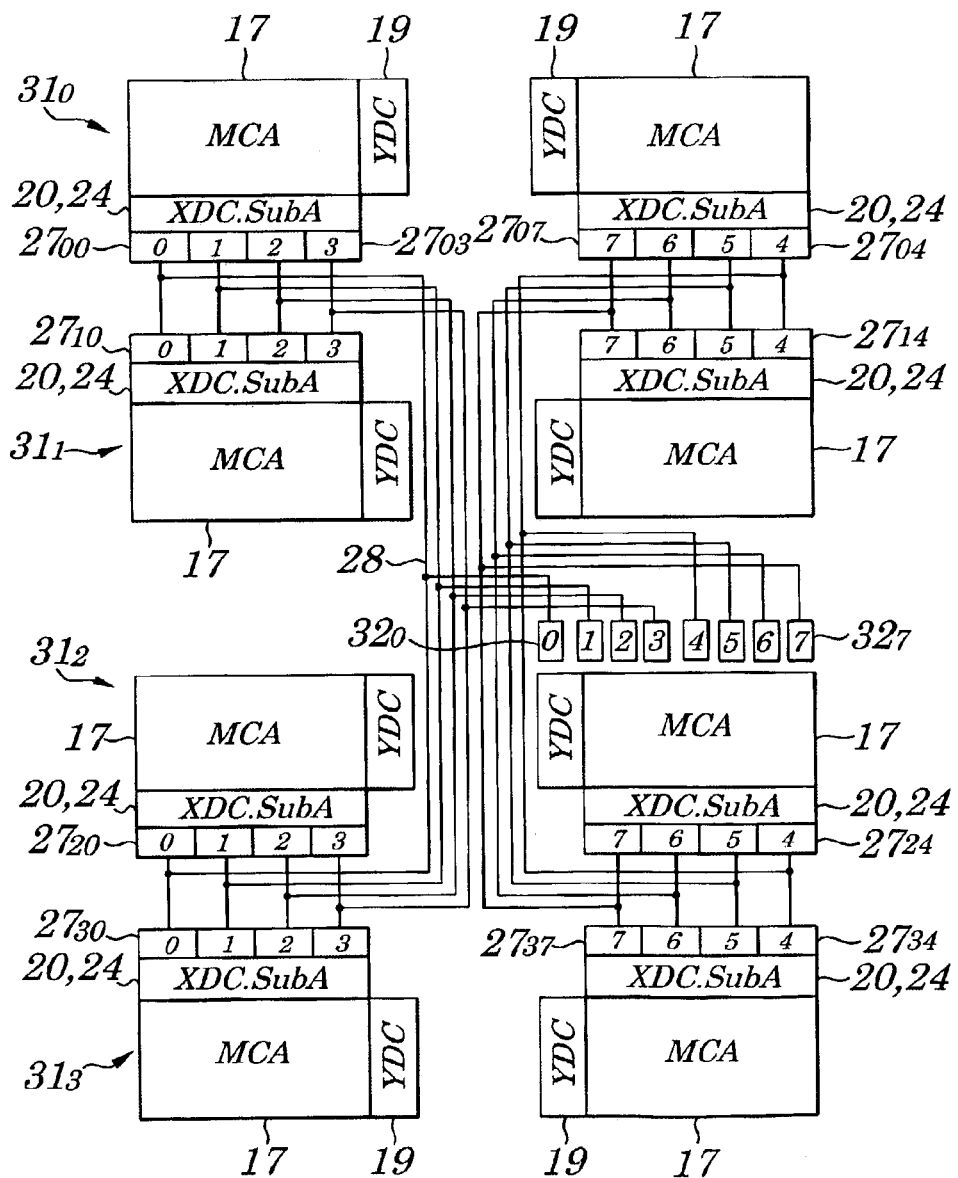
FIG. 12 is a layout of a main portion showing an arrangement of circuits making up a second conventional semiconductor memory device.

Since each of the global input and output lines 28 transfers 4-bit data and since one piece of a line making up the global lines 28 is made up of four sub-lines tied in a bundle, wiring using a total of 16 lines on a bit level is carried out in a wiring space 44 shown in FIG. 5. As a result, it is possible to reduce, to a half, an area of the wiring space 44 being placed in a central portion of the semiconductor chip compared with the second conventional semiconductor memory device shown in FIG. 12. Moreover, by placing the wiring region 51, a total length of the global input and output lines $28_0$ to $28_3$ can be made almost equal to a total length of the global input and output lines $28_4$ to $28_7$.

As described above, in the semiconductor memory device of the fourth embodiment, out of a plurality of the MAs 27 corresponding to a plurality of the DQ pads 32 being arranged so as to meet specifications of standardization by the JEDEC (Joint Electron Device Engineering Council), the MAs 27 in numbers corresponding to a half of numbers of the DQ pads 32 are arranged in a manner that they are divided into two groups on a left side and a right side in the semiconductor chip. The MAs 27 belonging to a MA group being placed far from the DQ pads 32 are arranged in same order as the corresponding DQ pads 32 and the MAs 27 belonging to a MA group being placed near to the DQ pads 32 are arranged in order being symmetrical to the order in which the corresponding DQ pads 32 are arranged. Moreover, the global input and output lines 28 to connect the MAs 27 to the DQ pads 32 are arranged in the wiring space 44 and the wiring region 51 in a distributed manner without being concentrated in certain places in each group of the MAs 27. Furthermore, in order to make the global input and output lines 28 be same in length, wiring is carried out in a manner that the global input and output lines being connected to an MA belonging to an MA group being placed near to the DQ pad extend through the wiring region 51 being placed on a right end of the semiconductor chip.

By employing the layout described above, the total length of the wirings can be reduced to about 18.5 mm. As a result, same effects as obtained in the first embodiment can be achieved in the fourth embodiment.

Fifth Embodiment

Figure 6:
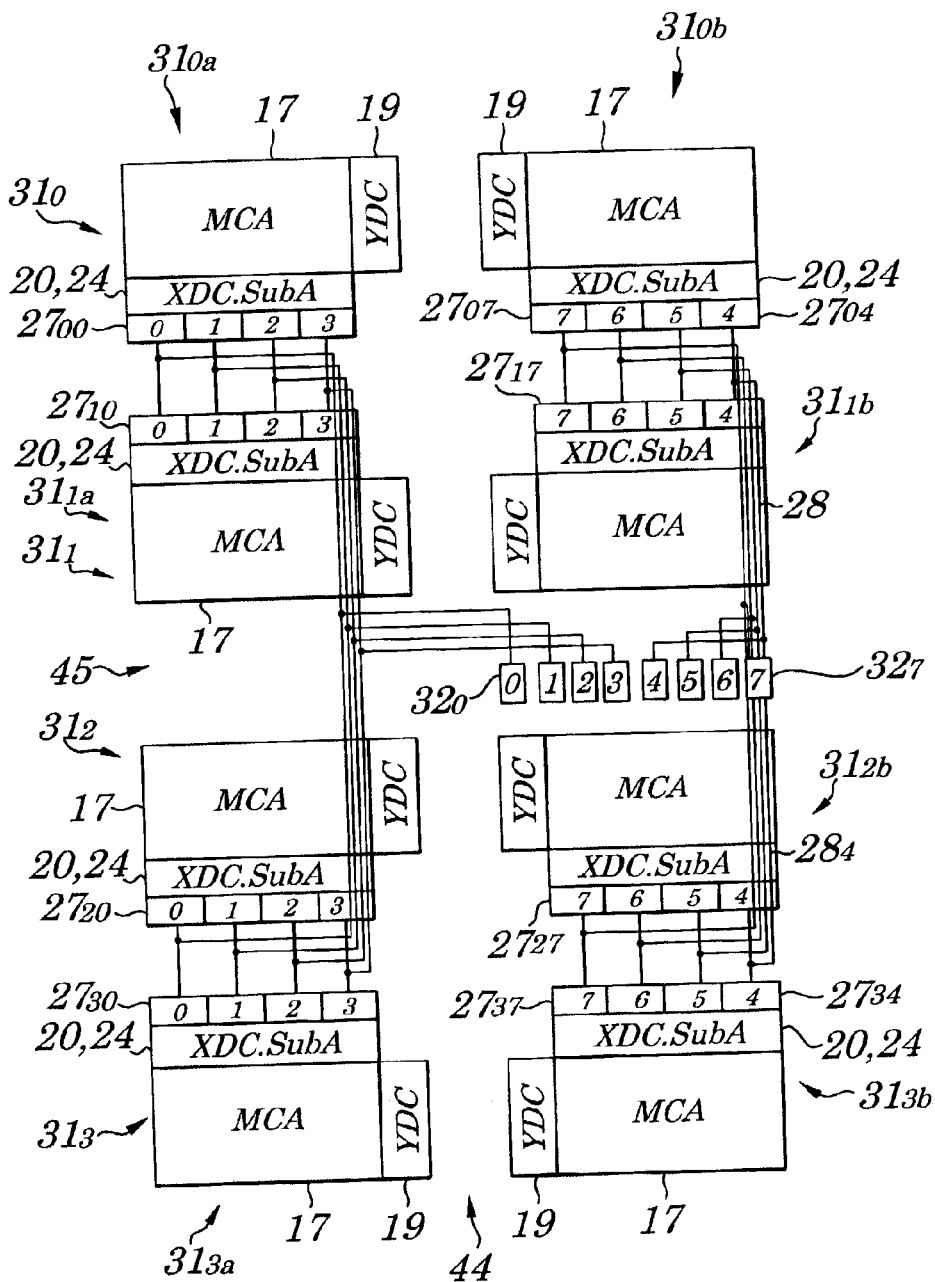
FIG. 6 is a layout of a main portion showing an arrangement of circuits making up a semiconductor memory device according to a fifth embodiment of the present invention.

FIG. 6 is a layout of a main portion showing an arrangement of circuits making up a semiconductor memory device according to a sixth embodiment of the present invention. The semiconductor memory device of the fifth embodiment has same configurations as the conventional semiconductor memory device shown in FIG. 8. Moreover, the semiconductor memory device of the fifth embodiment has same circuit arrangement as the semiconductor memory device of the fourth embodiment shown in FIG. 5, except wiring position of a global input and output line 28. In FIG. 6, same reference numbers are assigned to corresponding parts in FIG. 5 and their descriptions are omitted accordingly. In the semiconductor memory device of the fifth embodiment shown in FIG. 6, the global input and output lines 28 extend not through the wiring region 51 as shown in FIG. 5 but on MCAs 17. Normally, wiring on the MCAs 17 is carried out by a mesh power method in which a power line is placed between main word lines. A total number of wirings on the MCAs 17 is about 1,000 and power lines account for 80% and main word lines account for 20% of the total number of the wiring. According to the fifth embodiment, several lines out of the power lines accounting for 80% are used in wiring for the global input and output line 28.

In FIG. 6, at time of reading data, data being stored in a selected memory cell in the MCA 17 is read from the memory cell and is amplified by a sense amplifier 18 (not shown) and is transferred through a local input and output line 23 (not shown) to a SubA 24 and, after having been amplified therein, is transferred through a main input and output line 25 (not shown) to the MAs 27 and is again amplified therein and then reaches, through the global input and output line 28 and further through a FIFO memory 30 (not shown) and an outputting circuit 8, each of the corresponding DQ pads 32. Each of the MAs 27 of the fifth embodiment, as shown in FIG. 9, is made up of four pieces of the MAs $27_a$ to $27_d$ whose number corresponds to 4 bits to be pre-fetched, wherein 4-bit data, after having been amplified by each of the SMA $27_a$ to $27_d$, is transferred through the global input and output line $28_0$ to $28_7$ making up the global input and output line 28 to the FIFO memory 30.

Since each of the global input and output lines 28 transfers 4-bit data and since one piece of a line making up the global lines 28 is made up of four sub-lines tied in a bundle, wiring using a total of 16 lines on a bit level is carried out in a wiring space 44 shown in FIG. 5. As a result, almost no area of the wiring space 44 being placed in a central portion of a semiconductor chip is required, unlike in the case of the second conventional semiconductor memory device shown in FIG. 12. Moreover, a total length of the global input and output lines $28_0$ to $28_3$ can be made almost equal to a total length of the global input and output lines $28_4$ to $28_7$.

As described above, in the semiconductor memory device of the fifth embodiment, out of a plurality of the MAs 27 corresponding to a plurality of DQ pads 32 being arranged so as to meet specifications of standardization by the JEDEC (Joint Electron Device Engineering Council), the MAs 27 in numbers corresponding to a half of numbers of the DQ pads 32 are arranged in a manner that they are divided into two groups on a left side and a right side in the semiconductor chip. The MAs 27 belonging to a MA group being placed far from the DQ pads 32 are arranged in same order as the corresponding DQ pads 32 and the MAs 27 belonging to a MA group being placed near to the DQ pads 32 are arranged in order being symmetrical to the order in which the corresponding DQ pads 32 are arranged. Moreover, the global input and output lines 28 to connect the MAs 27 to the DQ pads 32 are arranged so as to extend over the MCAs 17 in a distributed manner without being concentrated in certain places in each of the groups of the MAs 27. Furthermore, in order to make the global input and output lines 28 be same in length, wiring is carried out in a manner that the global input and output lines being connected to an MA belonging to an MA group being placed near to the DQ pad extend over the MCAs 17 on the semiconductor chip.

By employing the layout described above, same effects as obtained in the fourth embodiment can be achieved. Moreover, since the wiring space 44 can be reduced and the wiring space 41 is not required, it is possible to reduce an area of its semiconductor chip.

Sixth Embodiment

Figure 7:
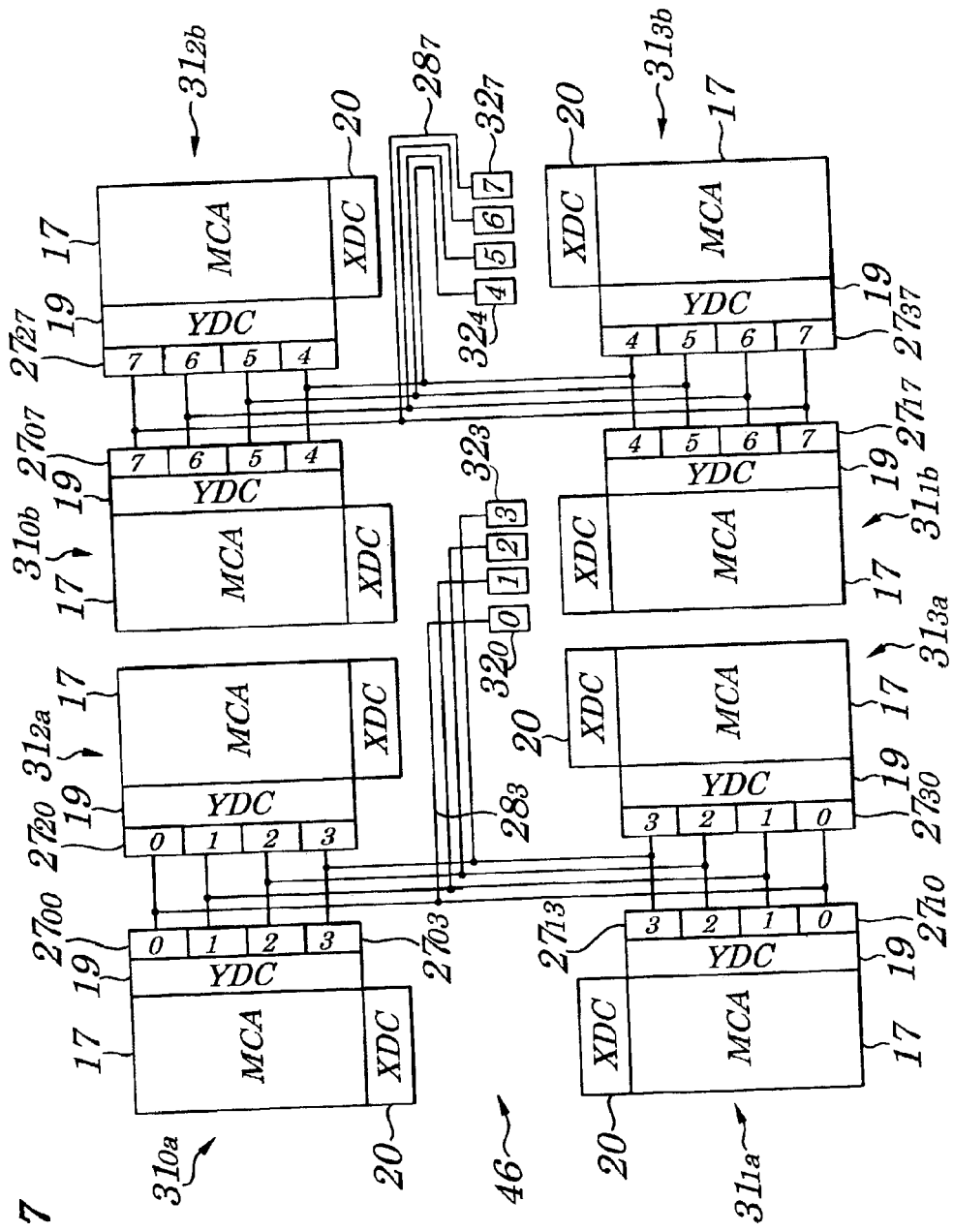
FIG. 7 is a layout of a main portion showing an arrangement of circuits making up a semiconductor memory device according to a sixth embodiment of the present invention.
Figure 13:
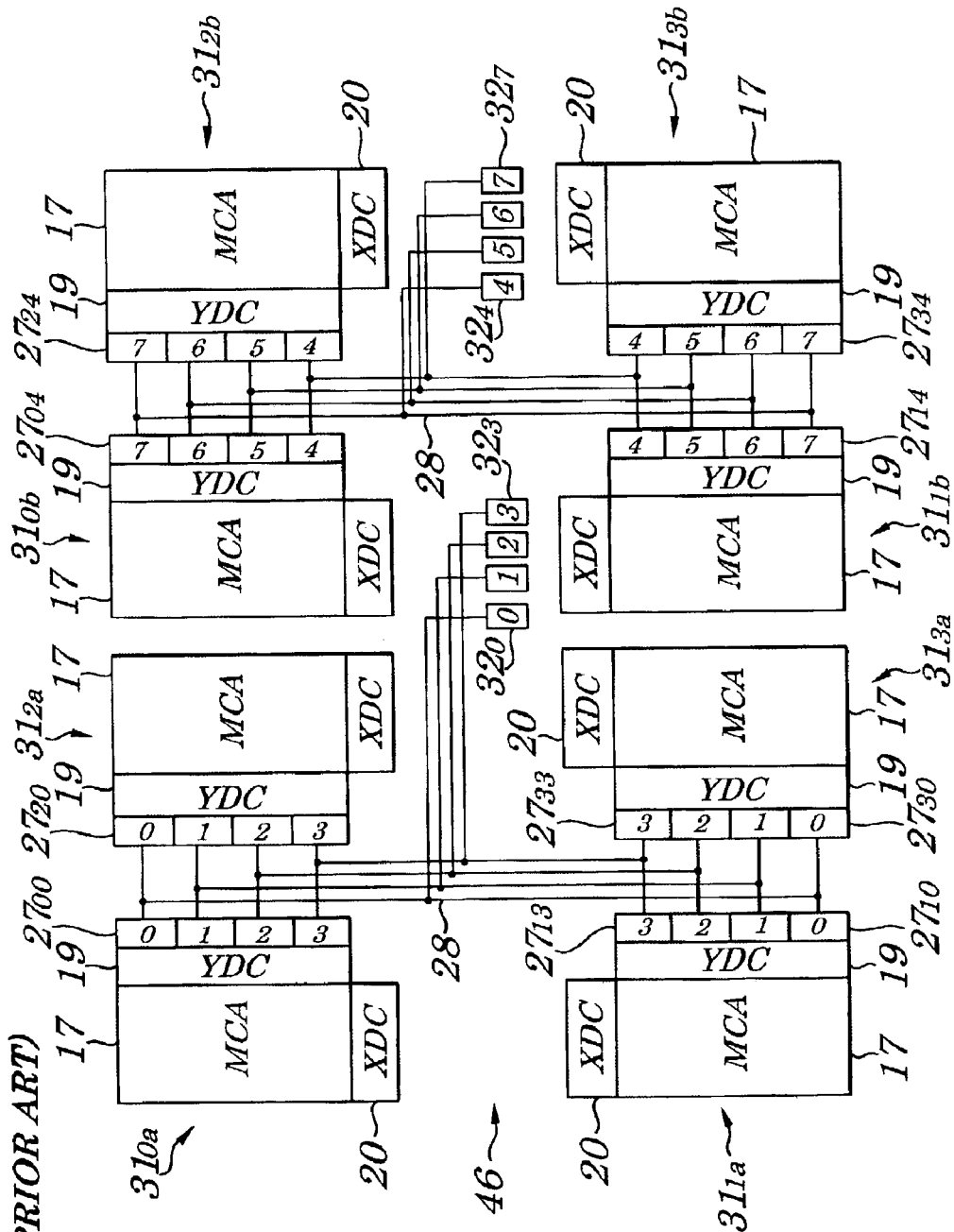
FIG. 13 is a layout of a main portion showing an arrangement of circuits making up a third conventional semiconductor memory device.
Figure 15:
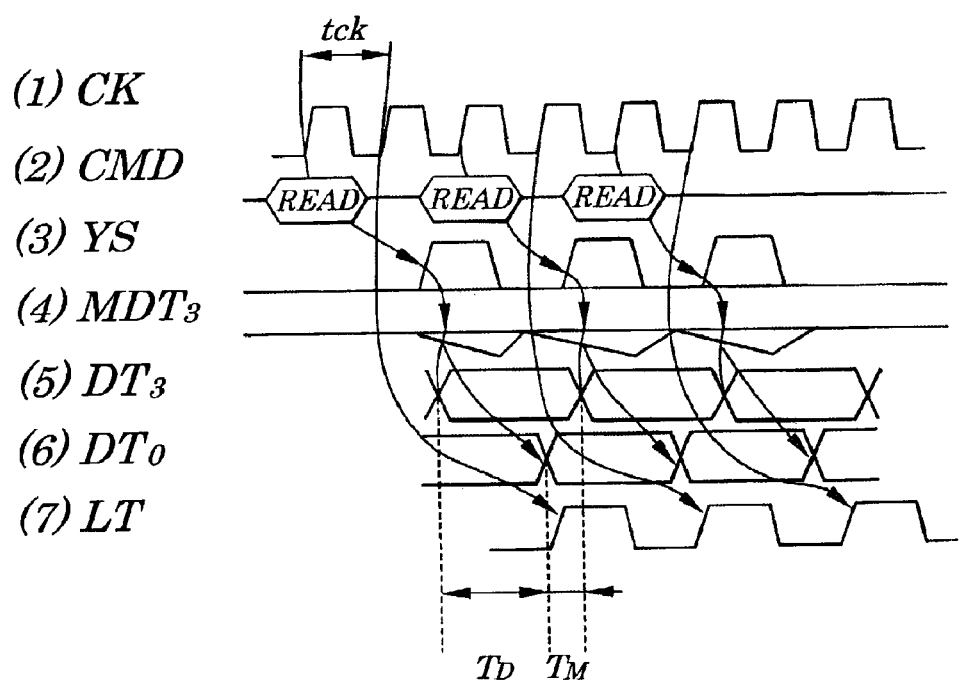
FIG. 15 is a timing chart explaining part of operations in each of the first to third conventional semiconductor memory devices.

FIG. 7 is a layout of a main portion showing an arrangement of circuits making up a semiconductor memory device according to a sixth embodiment of the present invention. The semiconductor memory device of the sixth embodiment includes four pieces of banks and is of an 8-bit DQ and 4-bit pre-fetch structure. In the semiconductor memory device of the sixth embodiment, the problem of the skew occurring in the global input and output lines 28 in the circuit arrangement of the third conventional semiconductor memory device shown in FIG. 13 has been solved. In FIG. 7, same reference numbers are assigned to corresponding parts in shown in FIG. 13 and their descriptions are omitted accordingly. In the semiconductor memory device shown in FIG. 7, DQ pads $32_0$ to $32_7$ are arranged from the left to the right. The MAs $27_{00}$ to $27_{03}$, MAs $27_{10}$ to $27_{13}$, MAs $27_{20}$ to $27_{23}$, and MAs $27_{30}$ to $27_{33}$ making up a total of eight pieces of MAs 27 in each bank and being placed far from each of corresponding DQ pads $32_0$ to $32_3$ are arranged from an upward direction to a downward direction along a right end or a left end of an MCA 17. On the other hand, the MAs $27_{04}$ to $27_{07}$, MAs $27_{14}$ to $27_{17}$, MAs $27_{24}$ to $27_{27}$, and MAs $27_{34}$ to $27_{37}$ making up a total of eight pieces of MAs 27 in each bank and being placed near to each of corresponding DQ pads $32_0$ to $32_3$ are arranged from a downward direction to an upward direction along a right end or a left end of the MCA 17.

The global input and output lines $28_0$ to $28_3$ to connect each of the MAs $27_{01}$ to $27_{03}$, MAs $27_{10}$ to $27_{13}$, MAs $27_{20}$ to $27_{23}$, and MAs $27_{30}$ to $27_{33}$ to each of the corresponding DQ pads $32_0$ to $32_3$ are made up of first lines each connecting the MAs $27_{00}$ to $27_{03}$, MAs $27_{10}$ to $27_{13}$, MAs $27_{20}$ to $27_{23}$, and MAs $27_{30}$ to $27_{33}$ faced opposing one other, second lines to connect first lines corresponding to one another and L-shaped third lines one end of each of which is connected to each of the corresponding second lines and another end of each of which is connected to each of corresponding DQ pads $32_0$ to $32_3$ being placed on a right side in FIG. 5 in a wiring space 46 being positioned in left and right directions in an approximately central portion of a semiconductor chip.

On the other hand, the global input and output lines $28_4$ to $28_7$ to connect each of the MAs $27_{04}$ to $27_{07}$ MAs $27_{14}$ to $27_{17}$, MAs $27_{24}$ to $27_{27}$, and MAs $27_{34}$ to $27_{37}$ to each of the corresponding DQ pads $32_4$ to $32_7$ are made up of first lines each connecting the MAs $27_{04}$ to $27_{07}$, MAs $27_{14}$ to $27_{17}$, MAs $27_{24}$ to $27_{27}$, and MAs $27_{34}$ to $27_{37}$ faced opposing one other, second lines to connect first lines corresponding to one another and third lines to connect each of the second lines to each of the corresponding DQ pads $32_4$ to $32_7$. The third lines making up the above global input and output lines $28_4$ to $28_7$, in order to make a length of each of the third line making up the global input and output lines $28_4$ to $28_7$ be equal to that of each of the third line making up the global input and output lines $28_0$ to $28_3$, extend from a point of intersection of each of the third line and each of the corresponding second lines making up the global input and output lines $28_4$ to $28_7$ from the left to the right through the wiring space 46 being placed in left and right directions in an approximately central portion of the semiconductor chip and, after having been extruded to a right side of the wiring space 46, extend downward and, further, after having extended to an approximately central portion in the wiring space 46 in a manner to turn back, again go downward to corresponding DQ pads $32_4$ to $32_7$.

In FIG. 7, at time of reading data, data being stored in a selected memory cell in the MCA 17 is read from the memory cell and is amplified by a sense amplifier 18 (not shown) and is transferred through a local input and output line 23 (not shown) to a SubA 24 (not shown) and, after having been amplified therein, is transferred through a main input and output line 25 (not shown) to the MAs 27 and is again amplified therein and then reaches, through a global input and output line 28 (not shown) and further through a FIFO memory 30 (not shown) and an outputting circuit 8 (not shown), each of the corresponding DQ pads 32. Each of the MAs 27 of the sixth embodiment, as shown in FIG. 9, is made up of four pieces of the MAs $27_a$ to $27_d$ whose number corresponds to 4 bits to be pre-fetched, wherein 4-bit data, after having been amplified by each of the SMA $27_a$ to $27_d$, is transferred through the global input and output line $28_0$ to $28_7$ making up the global input and output line 28 to the FIFO memory 30.

Since each of the global input and output lines 28 transfers 4-bit data and since one piece of a line making up the global lines 28 is made up of 4 sub-lines tied in a bundle, wiring using a total of 16 lines on a bit level is carried out in the wiring space 46 shown in FIG. 7. Also, since the global input and output lines $28_4$ to $28_7$ return back at the right end of the wiring space 46, though there is a fear that 32 lines are placed in a concentrated manner at the right end of the wiring space 46, no problems occur because wiring using other lines is not carried out in this portion. Moreover, in FIG. 7, the FIFO memory 30 and the outputting circuit 8 placed between the global input and output line 28 and the DQ pads $32_0$ to $32_7$ shown in FIG. 9 are not shown.

As described above, in the semiconductor memory device of the sixth embodiment, out of a plurality of the MAs 27 corresponding to a plurality of the DQ pads 32 being arranged so as to meet specifications of standardization by the JEDEC (Joint Electron Device Engineering Council), the MAs 27 in numbers corresponding to a half of numbers of the DQ pads 32 are arranged in a manner that they are divided into two groups on a left side and a right side in the semiconductor chip. The MAs 27 belonging to a MA group being placed far from the DQ pads 32 are arranged in same order as the corresponding DQ pads 32 and the MAs 27 belonging to a MA group being placed near to the DQ pads 32 are arranged in order being symmetrical to the order in which the corresponding DQ pads 32 are arranged. Moreover, the global input and output lines 28 connecting the MAs 27 to the DQ pads 32 are arranged in a distributed manner without being concentrated in certain places in each of the groups of the MAs 27. Furthermore, in order to make the global input and output lines 28 be equal in length, wiring is carried out in a manner that the global input and output lines being connected to an MA belonging to an MA group being placed near to the DQ pads 32 return back at the right end of the semiconductor chip.

By employing the layout described above, since lengths of the lines between the MAs 27 and the DQ pads $32_0$ to $32_7$ can be made same, it is possible to reduce skew. Therefore, even when data being stored the MCAs 17 making up different banks is read continuously, no inconvenience occurs unlike in the case of the first to third conventional semiconductor memory devices.

It is apparent that the present invention is not limited to the above embodiments but may be changed and modified without departing from the scope and spirit of the invention. For example, in each of the above embodiments, examples are shown in which the semiconductor memory device has memory capacity of 512 M bits and includes four or eight pieces of banks, however, the present invention is not limited to this, that is, the semiconductor memory device may have memory capacity of any number of bits, including 64 M bits, 128 M bits, 256 M bits, 1 G bits, 2 G bits or a like and may have any number of banks, including 2, 16, 32 or a like. Also, in each of the above embodiments, examples are shown in which each of the sub-banks has two pieces of the MCAs, however, the sub-bank may have any number of MCAs, including 1, 3, 4, 5 or more. Also, in each of the above embodiments, examples are shown in which each of the sub-banks has four pieces of MAs 27, however, each of the sub-banks may have any number of the MAs, including 2, 3, 6, or 8 and more.

Moreover, in each of the above embodiments, examples are shown in which a number of the DQ pads is 4, 12, 32, however, any number of the DQ pads may be placed. Also, in the above embodiments, examples are shown in which the DQ pads are placed in a right half of the wiring space as in FIGS. 1, 3, 5 to 7, however, so long as positions of the DQ pads can meet specifications for a semiconductor memory device, the DQ pads may be placed in a left half, an upper half, or a lower half of the wiring space. Furthermore, in each of the above embodiments, the present invention is applied to the synchronous-type DRAM being operable in the DDR mode, however, the present invention may be applied to a DRAM of a non-synchronous type and to a Rambus DRAM.

What is claimed is:

1. A semiconductor memory device comprising:
at least one piece of a memory cell array;
a plurality of sub-banks having a plurality of main amplifiers being placed in a vicinity of said memory cell array and being used to amplify data read from said memory cell array;
a plurality of data inputting and outputting pads arranged according to predetermined specifications in a wiring space placed among said plurality of said sub-banks;
a plurality of global input and output lines to connect said plurality of said main amplifiers and said plurality of said data inputting and outputting pads; and
wherein said plurality of said sub-banks is divided into a plurality of groups of said sub-banks and said plurality of said data inputting and outputting pads is divided in a manner so as to be corresponded to said plurality of said groups of said sub-banks and wherein said plurality of said main amplifiers belonging to one of said groups of said sub-banks being placed far from a corresponding plurality of said data inputting and outputting pads is arranged in same order as said corresponding plurality of said data inputting and outputting pads, and said plurality of said main amplifiers belonging to an other of said groups of said sub-banks being placed near to a corresponding plurality of data inputting and outputting pads is arranged in order symmetric to an order in which said corresponding plurality of said data inputting and outputting pads is arranged and wherein wiring of said plurality of said global input and output lines is carried out so that said plurality of said global input and output lines is placed in a distributed manner without being concentrated in certain places in each of said groups of said sub-banks.

2. The semiconductor memory device according to claim 1, wherein on a semiconductor chip are formed said at least one piece of said memory cell array, said plurality of sub-banks, said plurality of data inputting and outputting pads and said plurality of global input and output lines, and wherein said wiring of said plurality of said global input and output lines is carried out such that said plurality of said global input and output lines, after having extended to an end portion of said semiconductor chip along said wiring space, returns back toward a central portion of said wiring space, whereby said plurality of said global input and output lines connects said plurality of said main amplifiers belonging to said other of said groups of said sub-banks and said corresponding plurality of said data inputting and outputting pads.

3. The semiconductor memory device according to claim 1, wherein a plurality of said global input and output lines for connecting a plurality of said main amplifiers belonging to a specified one of said groups of said sub-banks to a corresponding plurality of said data inputting and outputting pads is placed in a different region from a region in which a plurality of said global input and output lines for connecting a plurality of said main amplifiers belonging to an other one of said groups of said sub-banks to a corresponding plurality of said data inputting and outputting pads is placed.

4. The semiconductor memory device according to claim 3, wherein said different region is a wiring region formed in a manner so as to be adjacent to an end portion of said semiconductor chip.

5. The semiconductor memory device according to claim 3, wherein said different region is a region existing on said memory cell arrays.

6. A semiconductor memory device comprising:

at least one piece of a memory cell array;

a plurality of sub-banks having a plurality of main amplifiers being placed in a vicinity of said memory cell array and being used to amplify data read from said memory cell array;

a plurality of data inputting and outputting pads arranged according to predetermined specifications in a wiring space placed among said plurality of said sub-banks;

a plurality of global input and output lines to connect said plurality of said main amplifiers and said plurality of said data inputting and outputting pads;

wherein on a semiconductor chip are formed said at least one piece of said memory cell array, said plurality of said sub-banks, said plurality of said data inputting and outputting pads and said plurality of said global input and output lines, and wherein said plurality of said sub-banks is divided into a plurality of groups of said sub-banks and said plurality of said data inputting and outputting pads is divided so as to be corresponded to said plurality of said groups of said sub-banks and said plurality of said main amplifiers making up respectively said plurality of said sub-banks belonging to one group are arranged in a manner so as to be symmetric to said plurality of said main amplifiers making up respectively said plurality of said sub-banks belonging to an other group being adjacent to said one group and wherein said plurality of said global input and output lines to connect each of said plurality of said main amplifiers making up respectively said plurality of said sub-banks belonging to said one group to each of said plurality of said data inputting and outputting pads being placed on a side of a central portion of said semiconductor chip in a first wiring space, after having extended along a second wiring space being orthogonal to said first wiring space, reaches said data inputting and outputting pads being placed on a side of said central portion of said semiconductor chip and said plurality of said global input and output lines to connect each of said plurality of said main amplifiers making up each of said plurality of said sub-banks belonging to said other group to each of said plurality of said data inputting and outputting pads being placed on a side of a back end of said semiconductor chip in said first wiring space, after having extended along a wiring region formed in a manner to be orthogonal to said first wiring space and to be adjacent to said back end of said semiconductor chip, reaches said plurality of said data inputting and outputting pads being placed on a side of an end portion of said semiconductor chip.

7. A semiconductor memory device comprising:

at least one piece of a memory cell array;

a plurality of sub-banks having a plurality of main amplifiers being placed in a vicinity of said memory cell array and being used to amplify data read from said memory cell array;

a plurality of data inputting and outputting pads arranged according to predetermined specifications in a wiring space placed among said plurality of said sub-banks;

a plurality of global input and output lines to connect said plurality of said main amplifiers and said plurality of said data inputting and outputting pads;

wherein on a semiconductor chip are formed said at least one piece of said memory cell array, said plurality of sub-banks, said plurality of data inputting and outputting pads and said plurality of global input and output lines, wherein said plurality of said sub-banks is divided into a plurality of groups of said sub-banks and said plurality of said data inputting and outputting pads is divided so as to be corresponded to said plurality of said groups of said sub-banks and said plurality of said main amplifiers making up each of said plurality of said sub-banks belonging to one group are arranged in a manner so as to be symmetric to said plurality of said main amplifiers making up each of said plurality of said sub-banks belonging to an other group being adjacent to said one group, and wherein said plurality of said global input and output lines to connect each of said plurality of said main amplifiers making up each of said plurality of said sub-banks belonging to said one group to each of said plurality of said data inputting and outputting pads being placed on a side of a central portion of said semiconductor chip in a first wiring space, after having been formed in a manner so as to be orthogonal to said first wiring space and instead of part of power lines to be formed on said memory cell arrays, reaches said plurality of said data inputting and outputting pads being placed on a side of a central portion of said semiconductor chip and said plurality of said global input and output lines to connect each of said plurality of said main amplifiers making up each of said plurality of said sub-banks belonging to said other group to each of said plurality of said data inputting and outputting pads being placed on a side of an end portion of said semiconductor chip, after having been formed in a manner to be orthogonal to said first wiring space and instead of part of power lines to be formed on said memory cell arrays, reaches said plurality of said data inputting and outputting pads being placed on a side of an end portion of said semiconductor chip.

* * * * *